United States Patent [19]

Kakimi et al.

[11] Patent Number: 5,252,423
[45] Date of Patent: Oct. 12, 1993

[54] LIGHT-SENSITIVE MATERIAL CONTAINING SILVER HALIDE REDUCING AGENT, POLYMERIZABLE COMPOUND, COLOR IMAGE FORMING SUBSTANCE, BASE PRECURSOR AND POLAR COMPOUND

[75] Inventors: Fujio Kakimi; Makoto Yamada, both of Kanagawa, Japan

[73] Assignee: Fuji Photo Film Co., Ltd., Kanagawa, Japan

[21] Appl. No.: 908,558

[22] Filed: Jun. 30, 1992

Related U.S. Application Data

[63] Continuation of Ser. No. 596,663, Oct. 11, 1990, abandoned.

[30] Foreign Application Priority Data

Oct. 11, 1989 [JP] Japan .................................. 1-264780
Apr. 13, 1990 [JP] Japan .................................. 2-98388

[51] Int. Cl.$^5$ ................................................ G03C 1/72
[52] U.S. Cl. ................................. 430/138; 430/617; 430/619; 430/955
[58] Field of Search ................ 430/138, 617, 619, 955

[56] References Cited

U.S. PATENT DOCUMENTS

| | | | |
|---|---|---|---|
| 3,347,675 | 10/1967 | Henn et al. | 430/490 |
| 4,758,496 | 7/1988 | Kakimi | 430/138 |
| 4,891,295 | 1/1990 | Kakimi | 430/138 |
| 4,927,731 | 5/1990 | Takahashi | 430/138 |
| 4,939,064 | 7/1990 | Nakamura | 430/138 |

FOREIGN PATENT DOCUMENTS 3253934 10/1988 Japan ............................... 430/138

*Primary Examiner*—Hoa Van Le
*Attorney, Agent, or Firm*—Sughrue, Mion, Zinn, Macpeak & Seas

[57] ABSTRACT

A light-sensitive material comprises a support and a light-sensitive layer provided thereon which contains silver halide, a reducing agent, a polymerizable compound, a color image forming substance and a base precursor. The silver halide, the reducing agent, the polymerizable compound, the color image forming substance and the base pre cursor are contained in microcapsules which are dispersed in the light-sensitive layer. According to the present invention, the color image forming substance is a coloredsubstance, namely a dye or a pigment, and the microcapsules further contain a polar compound such as an alcohol, an ether, an amide, an urea, an urethane and a sulfonamide. Most of the polar compounds preferably have a molecular weight in the range of 100 to 400. An exceptional polar compound is polyethylene glycol or its derivative, which preferably has a molecular weight in the range of 200 to 20,000. The polar compound has a function of preventing the base precursor from decomposition, which is accelerated by the dye or pigment. The polar compound is preferably attached on the surface of the particles of the base precursor.

8 Claims, No Drawings

LIGHT-SENSITIVE MATERIAL CONTAINING SILVER HALIDE REDUCING AGENT, POLYMERIZABLE COMPOUND, COLOR IMAGE FORMING SUBSTANCE, BASE PRECURSOR AND POLAR COMPOUND

This is a continuation of application Ser. No. 07/596,663 filed Oct. 11, 1990, now abandoned.

FIELD OF THE INVENTION

The present invention relates to a light-sensitive material comprising a support and a light-sensitive layer provided thereon which contains silver halide, a reducing agent, a polymerizable compound, a color image forming substance and a base precursor composed of a salt of an organic base with a carboxylic acid.

BACKGROUND OF THE INVENTION

Japanese Patent Provisional Publications No. 61(1986)-275742 and No. 61(1986)-278849 (the contents of these two publications are described in U.S. Pat. No. 4,912,011 and European Patent Provisional Publication No. 0203613A) disclose a light-sensitive material comprising a support and a light-sensitive layer provided thereon which contains silver halide, a reducing agent, a polymerizable compound and a color image forming substance. The silver halide, the reducing agent, the polymerizable compound and the color image forming substance are contained in microcapsules (light-sensitive microcapsules) which are dispersed in the light-sensitive layer.

An image forming method using the light-sensitive material comprises the steps of imagewise exposing to light the light-sensitive material to form a latent image of the silver halide, heating the light-sensitive material to polymerize the polymerizable compound within the area where the latent image has been formed, pressing the light-sensitive material on an image-receiving material to transfer the unpolymerized polymerizable compound with a color image forming substance to the image-receiving material, so as to form an image on the image-receiving material.

Further, a method of polymerizing the polymerizable compound within the area where the latent image of the silver halide has not been formed is disclosed in Japanese Patent Provisional Publications No. 61(1986)-243449, No. 61(1986)-260241 (the contents of these two publications are described in European Patent Provisional Publication No. 0202490A), No. 2(1990) 141756 and No. 2(1990)-141757.

The development and polymerization reactions in the image forming method smoothly proceed in alkaline conditions. Therefore, the light-sensitive layer of the light sensitive material preferably contains a base precursor as an image formation accelerator. Various base precursors have been known, as is described in Japanese Patent Provisional Publication No. 62(1987)-264041 (corresponding to U.S. Pat. No. 4,792,514 and European Patent Provisional Publication No. 0203613A).

In order to accelerate the development and polymerization reactions, it is preferred to incorporate the base precursor into light-sensitive microcapsules, as is described in Japanese Patent Provisional Publications No. 64(1989)-32251 (corresponding to U S. Pat. No. 4,939,064 and European Patent Provisional Publication No. 0301539A) and No. 1(1989)-263641, and Japanese Patent Applications No. 1(1989)-182245 and No. 1(1989)-160148. The base precursor is composed of a salt of an organic base with a carboxylic acid, and is generally used in the form of solid particles.

SUMMARY OF THE INVENTION

The present inventors have studied the above-mentioned light-sensitive material wherein a base precursor is contained in light-sensitive microcapsules, and noted that the base precursor contained in the microcapsules tends to be decomposed in a specific condition. The inventors further note that the decomposition of the base precursor is accelerated by a colored substance such as a dye and a pigment. The decomposition of the base precursor has not been observed in experiments disclosed in Japanese Patent Provisional Publication No. 64(1989)-32251 (corresponding to U.S. Pat. No. 4,939,064 and European Patent Provisional Publication No. 0301539A), since a leuco dye is used as the color image forming substance in the experiments.

Accordingly, it is necessary to prevent the base precursor from decomposition in the case that a dye or pigment is used as a color image forming substance in place of the leuco dye.

An object of the present invention is to provide a light-sensitive material which is improved in stability even if a dye or pigment is used as a color image forming substance.

According to study of the present inventors, it is found that a polar compound such as an alcohol, an ether, an amide and a sulfonamide has a function of preventing the base precursor from decomposition, which is accelerated by the dye or pigment.

There is provided by the present invention a light-sensitive material comprising a support and a light-sensitive layer provided thereon which contains silver halide, a reducing agent, an ethylenically unsaturated polymerizable compound, a color image forming substance and a base precursor composed of a salt of an organic base with a carboxylic acid, said silver halide, said reducing agent, said polymerizable compound, said color image forming substance and said base precursor being contained in microcapsules which are dispersed in the light-sensitive layer, wherein the color image forming substance is a dye or a pigment, and the microcapsules further contain a polar compound selected from the group consisting of an alcohol, an ether, an amide, an urea, an urethane and a sulfonamide.

A polar compound having a melting point in the range of 30° to 250° C. has been used in a light-sensitive material disclosed in Japanese Patent Provisional Publications No. (1988)-243935 and No. 63(1988)-253934 (the contents of these two publications are described in U.S. Pat. No. 4,927,731). In the light-sensitive material of these publications, the polar compound functions as a carrier of a base formed from a base precursor which is arranged outside of microcapsules. Therefore, it has been understood that the polar compound is of little value in the light-sensitive material wherein the base precursor is contained in microcapsules.

The present inventors have found the above-mentioned new function of the polar compound. The polar compound protects a base precursor from a colored substance, namely a dye or pigment. The polar compound is preferably attached on the surface of the particles of the base precursor to protect the particles.

Therefore, the light-sensitive material of the present invention is improved in stability though both of the base precursor and the dye or pigment are contained in microcapsules.

DETAILED DESCRIPTION OF THE INVENTION

Various polar compounds are disclosed in Japanese Patent Provisional Publications No. 63(1988)-243935 and No. 63(1988)-253934, and U.S. Pat. No. 4,927,731. These known polar compounds can be used in the present invention. However, the function of the polar compound used in the present invention is different from the function in the above-mentioned publications. Therefore, there is a difference in the preferred embodiment of the polar compound. In detail, the melting point defined in the publications is of no value in the present invention.

In the present invention, most of the polar compounds preferably have a molecular weight in the range of 100 to 400. An exceptional polar compound is polyethylene glycol or its derivative, which preferably has a molecular weight in the range of 200 to 20,000.

The polar compound preferably has a polar group of the formula $-OR^1$, $SO_2NR^1R^2$, $-CONR^1R^2$, $-NR^2SO_2R^1$, $-NR^2COR^1$, $-NH-CO-NR^1R^2$ or $-NH-COOR^1$, wherein each of $R^1$ and $R^2$ independently is hydrogen or an alkyl group having 1-3 carbon atoms. In more detail, the polar compound preferably has the following formula (I):

$$(G)_n-Q-(L)_l-M-(G')_m \qquad (I)$$

wherein L is a divalent linking group; each of M and Q independently is an aliphatic hydrocarbon residue; each of G and G' independently is $-OR^1$, $-SO_2NR^1R^2$, $-CONR^1R^2$, $-NR^2SO_2R^1$, $-NR^2COR^1$, $-NH-CO-NR^1R^2$ or $-NH-COOR^1$ wherein each of $R^1$ and $R^2$ independently is hydrogen or an alkyl group having 1-3 carbon atoms, l is 0 or 1; and each of m and n independently is 0 or an integer of 1-10 on condition that m+n is 1-10.

Examples of the divalent linking group represented by

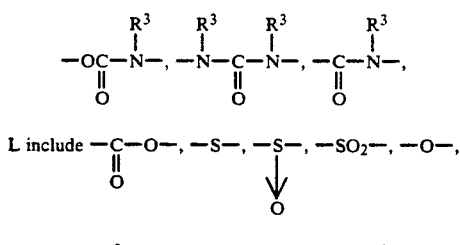

(wherein $R^3$ is hydrogen or an alkyl group, and $R^4$ is an alkyl group or an aryl group).

M is an (m+1)-valent aliphatic hydrocarbon residue. Q is an (n+1)-valent aliphatic hydrocarbon residue. Hydrogen atoms contained in M and Q can be partially substituted with halogen atoms.

Examples of the polar compound of the formula (I) include sorbitol, dulcitol, pentaerythritol, trimethylolethane, hexanediol, cyclohexanediol, saponin, decanediol, xylulose, nonanediol, dimethylol urea, ethylene glycol, poropylene glycol, polypropylene glycol, octanediol, hexanetriol, trimethylolpropane, octamethylene glycol, tetraethylene glycol, pentaethylene glycol, glycerol, glyceride and the following compounds (1) to (38). These examples are given by no means to restrict the invention.

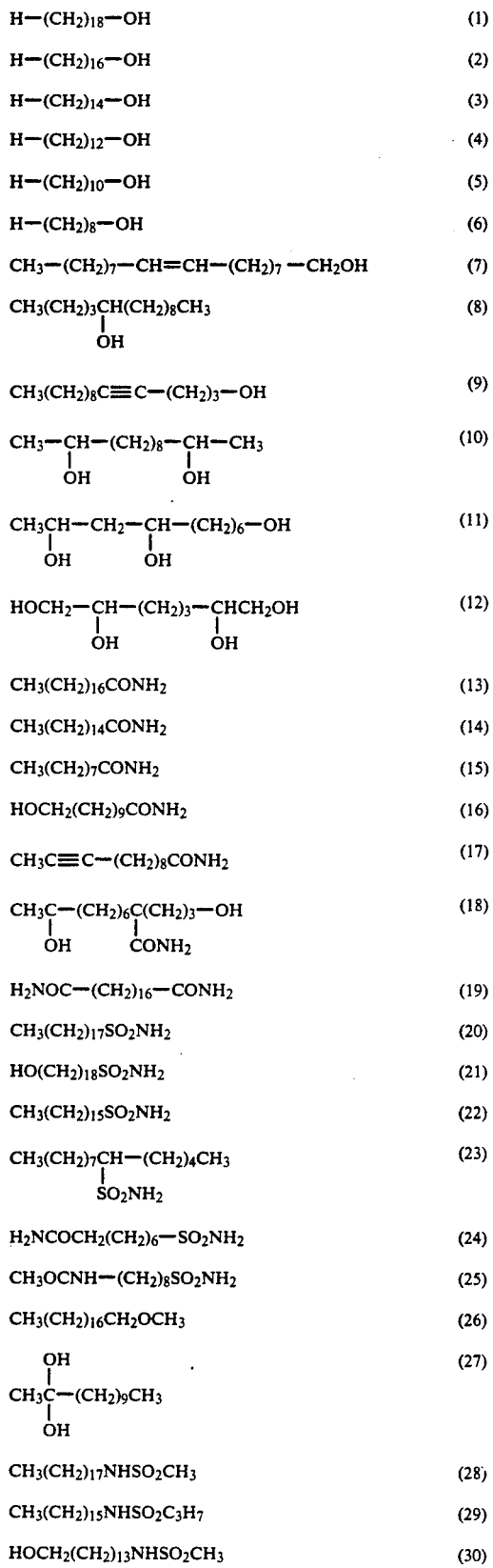

CH₃CH=CH(CH₂)₁₂NHSO₂C₂H₅ (31)

CH₃CH—(CH₂)₈NHSO₂CH₃ (32)
|
OH

CH₃CHCH₂CH(CH₂)₈CH₃ (33)
|         |
OH    NHSO₂CH₃

CH₃(CH₂)₈NHCOCH₃ (34)

HO(CH₂)₁₂NHCOC₂H₅ (35)

H₃C(H₂C)₅—CH—(CH₂)₇—NHCOC₃H₇ (36)
|
OH

CH₃SO₂NH(CH₂)₆—CH—(CH₂)₂CONH₂ (37)
|
OH

Cl—(CH₂)₁₈—OH (38)

$$C_8H_{17}NH-\underset{\underset{O}{\|}}{C}-NH_2 \quad (39)$$

$$C_{12}H_{25}-NH\underset{\underset{O}{\|}}{C}-NHCH_3 \quad (40)$$

$$C_{13}H_{27}\underset{\underset{O}{\|}}{C}NHCH_3 \quad (41)$$

$$C_8H_{17}-O-C_2H_4-NH\underset{\underset{O}{\|}}{C}-CH_3 \quad (42)$$

$$C_{13}H_{27}\underset{\underset{O}{\|}}{C}NHCH_2CH_2OH \quad (43)$$

$$C_8H_{17}NH\underset{\underset{O}{\|}}{C}-OCH_3 \quad (44)$$

$$CH_3O-\underset{\underset{O}{\|}}{C}NH(CH_2)_{12}-NH\underset{\underset{O}{\|}}{C}-OCH_3 \quad (45)$$

The polar compound of the formula (I) preferably has a molecular weight in the range of 100 to 400. Further, the polar compound preferably has a solubility in water of not more than 5 weight % at 25° C.

An alcohol having a molecular weight in the range of 100 to 400 is particularly preferred.

In the case that the polar compound is polyethylene glycol or its derivative, the compound preferably has the following formula (II):

$$R^5\!\!-\!\!(CH_2CH_2O)_q\!\!-\!\!H \quad (II)$$

wherein $R^5$ is a monovalent group selected from the group consisting of a hydroxy group, an alkoxy group, a polyalkoxy group consisting of alkoxy groups each of which has 3 or more carbon atoms, an aryloxy group, an amino group, an acylamino group and an acyloxy group; and q is an integer of not less than 2.

In the formula (II), q is preferably an integer of 2–500.

$R^5$ preferably is a hydroxy group, namely, the polar compound of the formula (II) preferably is polyethylene glycol.

The polar compound of the formula (II) preferably has a molecular weight in the range of 200 to 20,000.

The compound of the formula (II) in which $R^5$ is a group having a hydrophobic moiety such as an alkoxy group, an aryloxy group, an N-substituted amino group, an acylamino group, an acyloxy group has been used as a nonionic surface active agent.

With respect to the polyethylene glycol nonionic surface active agents, the structure, the property and the process for the preparation are described in Surfactant Science Series volume 1, Nonionic Surfactants (Edited by Martin J. Schick, Marcel Dekker Inc. 1967); and Surface Active Ethylene Oxide Adducts (by Schoufeldt. N, Pergamon Press 1969). The nonionic surface active agents described in the references are preferably employed for the invention.

The polyethylene glycol nonionic surface active agent can be classified based on the structure into alcohol ethylene oxide adducts, alkylphenol ethylene oxide adducts, fatty acid ethylene oxide adducts, polyhydric alcohol-fatty acid ester ethylene oxide adducts, alkylamine ethylene oxide adducts, fatty acid amide ethylene oxide adducts, fats ethylene oxide adducts and polypropylene glycol ethylene oxide adducts.

Examples of alcohol ethylene oxide adducts include adducts produced from synthetic alcohol such as lauryl alcohol, cetyl alcohol and oleyl alcohol; natural alcohol such as coconut oil reduced alcohol and beef tallow reduced alcohol; and alcohol having a methyl branch such as oxoalcohol and secondary alcohol. There is no difference in function between a compound and a mixture. Therefore, a mixture of these compounds can be employed.

Examples of alkylphenol ethylene oxide adducts include adducts produced from nonylphenyl, dodecylphenol, octylphenol, octylcresol. Either of branched-chain phenol and normal chain phenol can be employed.

Examples of fatty acid ethylene oxide adducts, in other words nonionic surface active agents of polyethylene glycol ester type include adducts produced from higher fatty acid such as lauric acid and oleic acid.

Polyhydric alcohol-fatty acid ester ethylene oxide adducts are produced from partial ester of fatty acid and polyhydric alcohol such as glycerol and sorbitol.

Alkylamine and fatty acid amide ethylene oxide adducts are produced from laurylamine, oleic acid amine and the like.

Polypropylene glycol ethylene oxide adducts can be produced by using polypropylene glycol having a molecular weight in the range of 1,000–2,500 as a hydrophobic material.

The polar compound of the present invention is preferably contained in microcapsules by adding directly to a silver halide emulsion or a polymerizable compound. It is particularly preferred to add the polar compound to the polymerizable compound.

The polar compound of the present invention is preferably used in an amount of 0.5 to 50 weight %, more preferably 1 to 20 weight % based on the amount of polymerizable compound.

The polar compound is preferably attached on the surface of the particles of the base precursor to protect the particles.

A base precursor is composed of a salt of an organic base with a carboxylic acid. The organic base preferably is a diacidic, triacidic or tetraacidic base which is composed of two to four guanidine moieties and at least one residue of a hydrocarbon or a heterocyclic ring as a linking group or the guanidine moieties, said guanidine moiety corresponding to an atom group formed by removing one or two hydrogen atoms from the compound having the following formula (III):

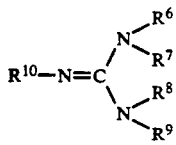
(III)

wherein each of $R^6$, $R^7$, $R^8$, $R^9$ and $R^{10}$ independently is a monovalent group selected from the group consisting of hydrogen atom, an alkyl group, an alkenyl group, an alkynyl group, a cycloalkyl group, an aralkyl group, an aryl group and a heterocyclic group (hydrogen, an alkyl group, a cycloalkyl group, an aralkyl group and an aryl group are preferred); and any two of $R^6$, $R^7$, $R^8$, $R^9$ and $R^{10}$ may be combined together to form a five-membered or six-membered nitrogen-containing heterocyclic ring.

Each of an alkyl group, an alkenyl group and an alkynyl group preferably has 1-6 carbon atoms. An example of a cycloalkyl group is cyclohexyl. An example of an aralkyl group is benzyl. An example of an aryl group is phenyl.

The guanidine moiety preferably is a monovalent substituent group of a hydrocarbon or heterocyclic ring, as is shown in the formula (IV) shown below. In other words, it is preferred that the guanidine moiety corresponds to an atomic group formed by removing one hydrogen atom from a compound of the formula (III). However, the guanidine moiety may correspond to an atomic group formed by removing two hydrogen atoms from the compound of the formula (III). In this case, the organic base may be in the form of a nitrogen-containing heterocyclic compound (e.g., piperazine ring).

A diacidic, triacidic or tetraacidic base of the following formula (IV) is preferably used for the base precursor.

$$R^{11}(-B)_r \qquad (IV)$$

In the formula (IV), $R^{11}$ is an r-valent hydrocarbon residue or a heterocyclic compound residue; and r is an integer of 2, 3 or 4. Further, r preferably is 2 or 4, and more preferably is 2. In the case that r is 2, the hydrocarbon residue of $R^{11}$ preferably is an alkylene group (more preferably having 1-6 carbon atoms) or the arylene group (more preferably phenylene). An example of the heterocyclic compound residue of $R^{11}$ is a residue derived from a pyridine ring.

A diacidic, triacidic or tetraacidic base of the formula (IV) preferably has a symmetrical structure. In the present specification, "a symmetrical structure" means that all of "B" are equivalent in the molecule. In other words, it means that any isomer is not formed even if the groups of B are replaced with different groups.

B in the formula (IV) is a monovalent group corresponding to an atomic group formed by removing one hydrogen atom from the compound of the formula (III).

Examples of the organic base preferably used in the invention are given below.

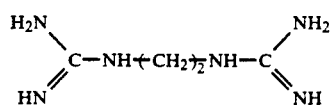
(B-1)

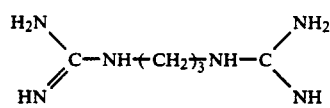
(B-2)

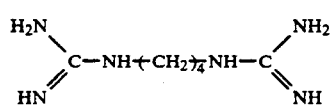
(B-3)

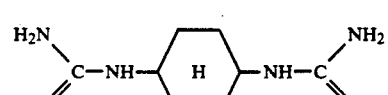
(B-4)

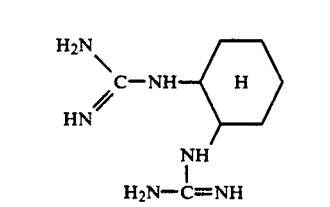
(B-5)

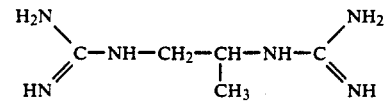
(B-6)

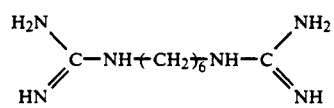
(B-7)

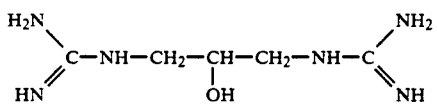
(B-8)

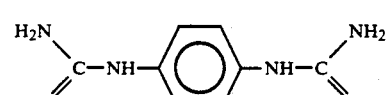
(B-9)

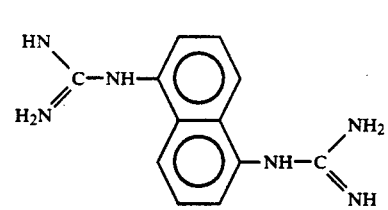
(B-10)

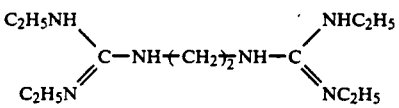
(B-11)

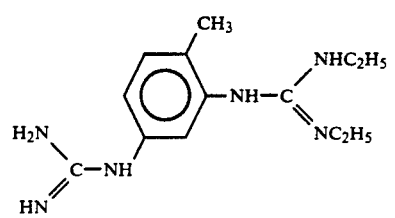
(B-12)

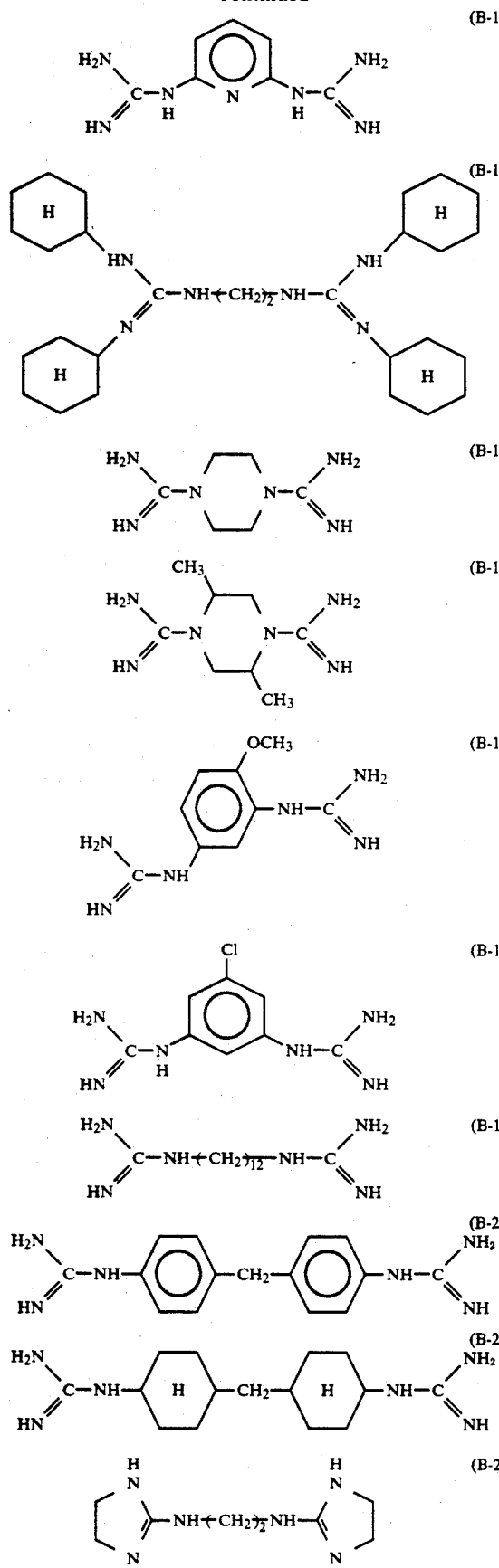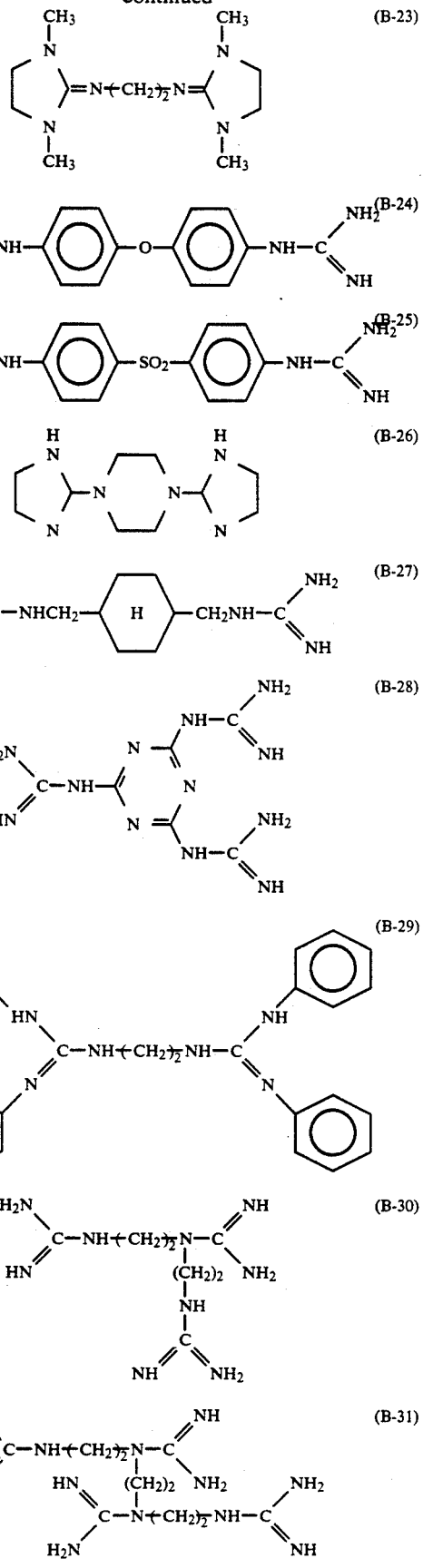

A carboxylic acid of the base precursor used in the invention has a property that the carboxyl group in the acid is decarboxylated under a certain condition. Since a carboxyl group generally has this property, various carboxylic acids can be used for the base precursor.

The carboxyl group preferably is decarboxylated at an elevated temperature. The temperature preferably is in the range of 50° to 200° C., and more preferably 80° to 160° C.

Examples of the carboxylic acid include trichloroacetic acid, propiolic acid and sulfonylacetic acid. The carboxylic acid preferably has an aryl group or an arylene group as a decarboxylation promoting group. The carboxylic acid more preferably is a sulfonylacetic acid expressed of the following formula (V-1) or a propiolic acid of the following formula (V-2).

$$Y(-SO_2-\underset{R^{11}}{\overset{R^{10}}{\underset{|}{\overset{|}{C}}}}-CO_2H)_m \quad \text{(V-1)}$$

In the formula (V-1), each of $R^{10}$ and $R^{11}$ is a monovalent group selected from the group consisting of hydrogen, an alkyl group, an alkenyl group, a cycloalkyl group, an aralkyl group, an aryl group and a heterocyclic group. Hydrogen, an alkyl group and an aryl group are preferred, and particularly preferred is hydrogen. Each of the groups may have one and more substituent groups. Each of an alkyl group, an alkenyl group and an alkynyl group preferably has 1–8 carbon atoms. $R^{10}$ and $R^{11}$ may be combined with each other to form a ring.

In the formula (V-1), m is 1 or 2. In the case that m is 1, Y is a monovalent group selected from the group consisting of an alkyl group, a cycloalkyl group, an alkenyl group, an alkynyl group, an aralkyl group, an aryl group and a heterocyclic group. An aryl group and a heterocyclic group are preferred, and particularly preferred is an aryl group. Each of the groups may have one and more substituent groups. Examples of the substituent group include a halogen atom, an alkyl group, an alkoxy group, an alkylsulfonyl group, an arylsulfonyl group, an acylamino group, a carbamoyl group and a sulfamoyl group.

In the case that m is 2, Y is a divalent group selected from the group consisting of an alkylene group, an arylene group and a heterocyclic group. An arylene group and a heterocyclic group are preferred, and particularly preferred is an arylene group. Each of the groups may have one and more substituent groups. Examples of the substituent group are the same as the above-mentioned substituent groups of an aryl group.

$$Z(-C\equiv C-CO_2H)_n \quad \text{(V-2)}$$

In the formula (III-2), n is 1 or 2. In the case that n is 1, Z is a monovalent group selected from the group consisting of hydrogen, an alkyl group, a cycloalkyl group, an alkenyl group, an alkynyl group, an aralkyl group, an aryl group, a heterocyclic group and carboxyl. An aryl group is particularly preferred. Each of the groups may have one and more substituent groups.

In the case that m is 2, Z is a divalent group selected from the group consisting of an alkylene group, an arylene group and a heterocyclic group. Arylene group is particularly preferred. Each of the groups may have one and more substitutes.

Examples of the carboxylic acid are given below.

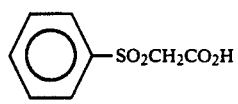
(A-1)

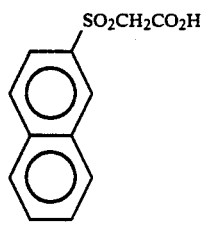
(A-2)

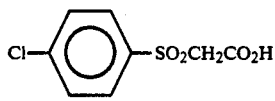
(A-3)

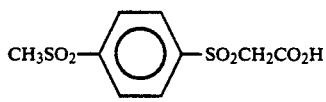
(A-4)

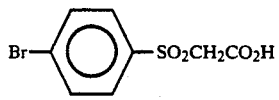
(A-5)

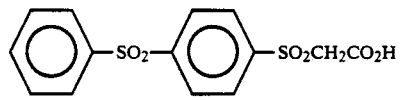
(A-6)

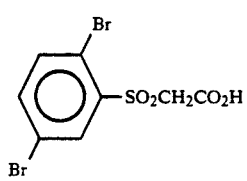
(A-7)

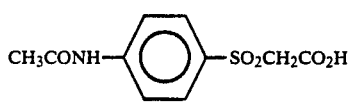
(A-8)

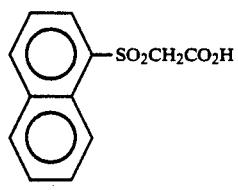
(A-9)

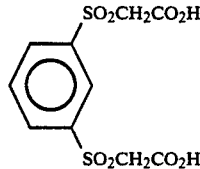
(A-10)

(A-11)

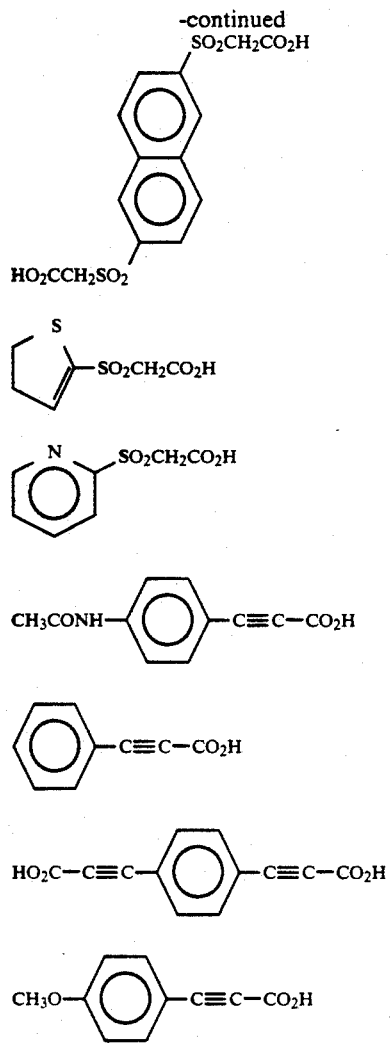

The base precursor is preferably composed of a salt of the above-mentioned organic base with the above-mentioned carboxylic acid. There is no specific limitation with respect to the combination of the carboxylic acid and the organic base. However, the melting point of the salt of the organic base with the carboxylic acid preferably is in the range of 50° to 200° C., more preferably 80° to 120° C.

Examples of a base precursor are given below.

-continued
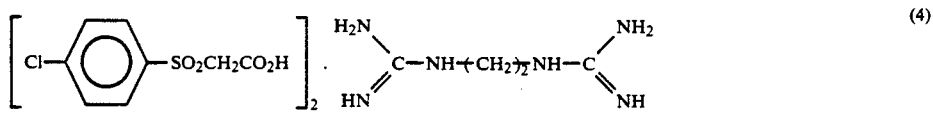 (4)
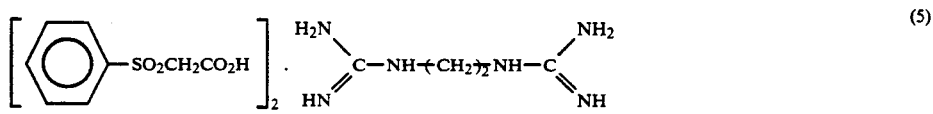 (5)
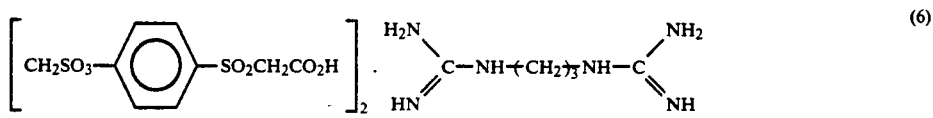 (6)
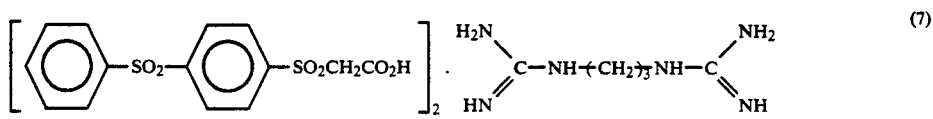 (7)
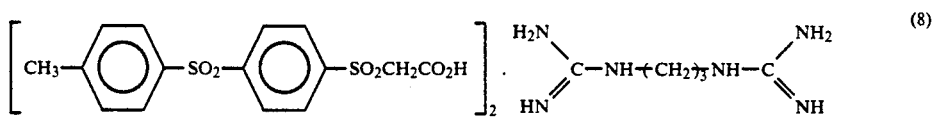 (8)
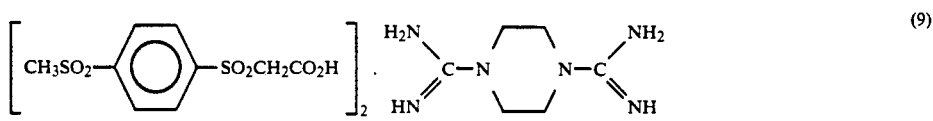 (9)
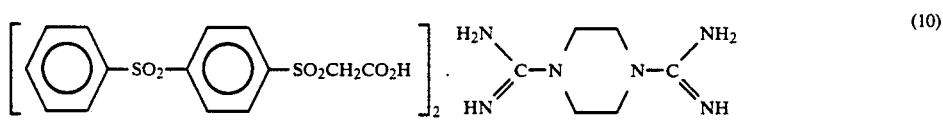 (10)
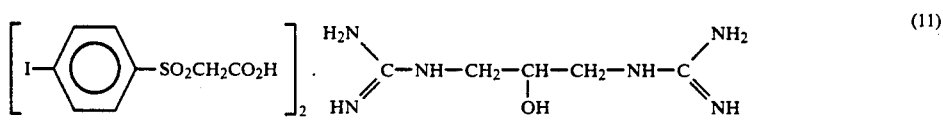 (11)
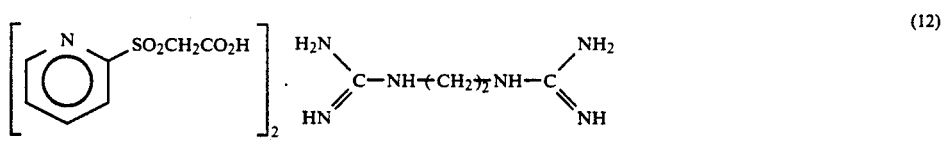 (12)
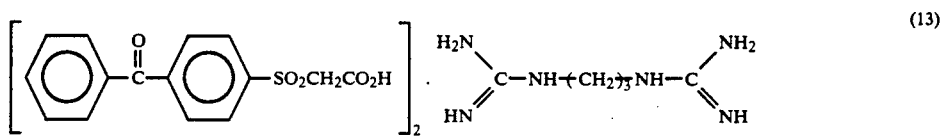 (13)
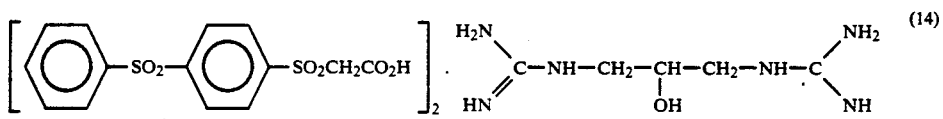 (14)
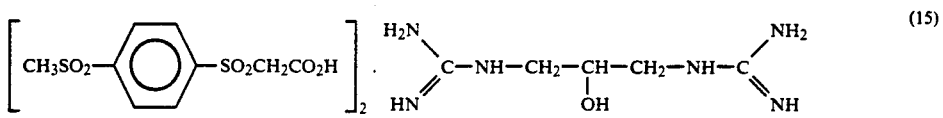 (15)

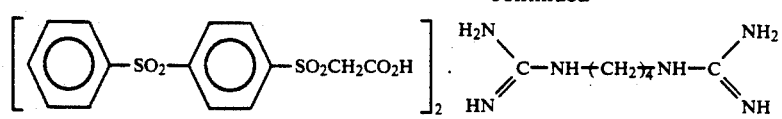 (16)
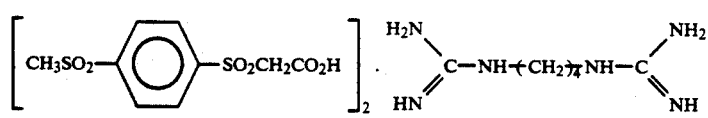 (17)
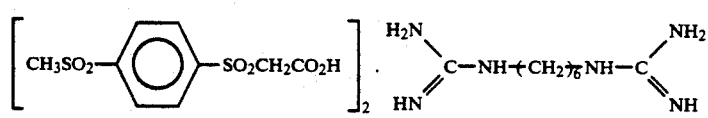 (18)
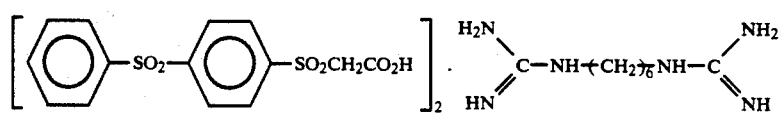 (19)
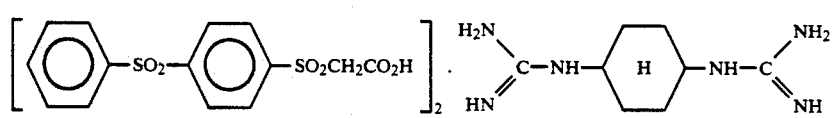 (20)
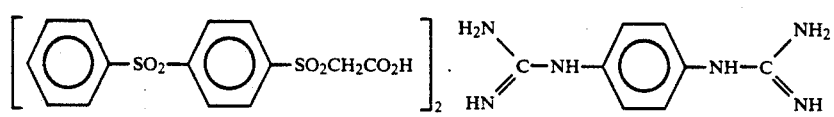 (21)
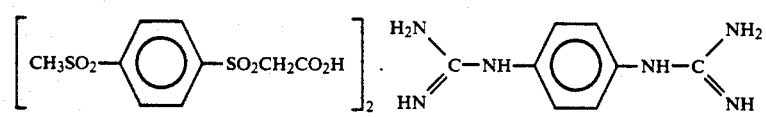 (22)
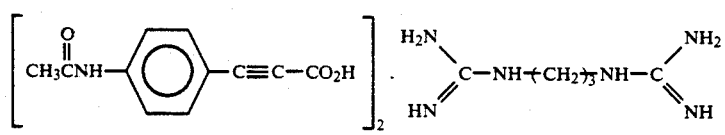 (23)
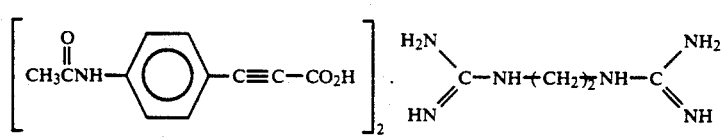 (24)
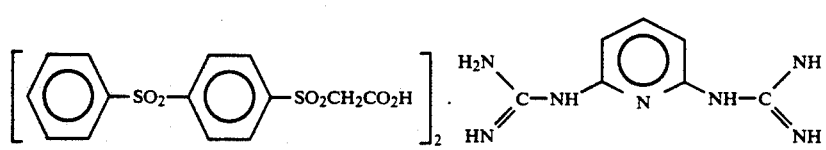 (25)
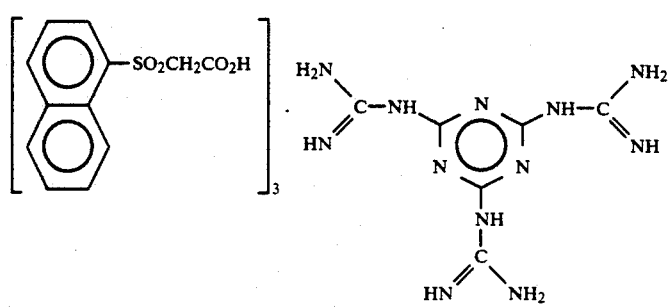 (26)

-continued
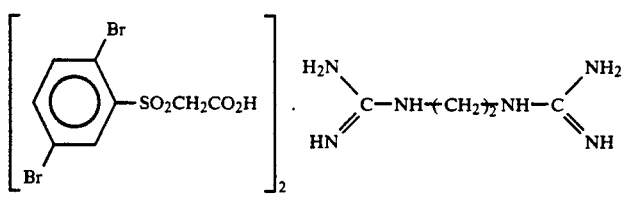 (27)
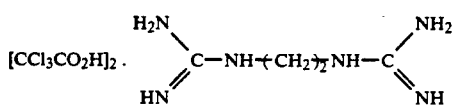 (28)
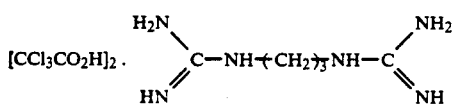 (29)
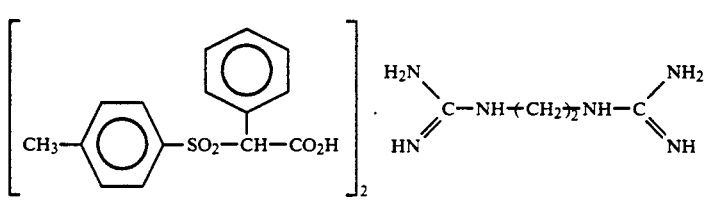 (30)
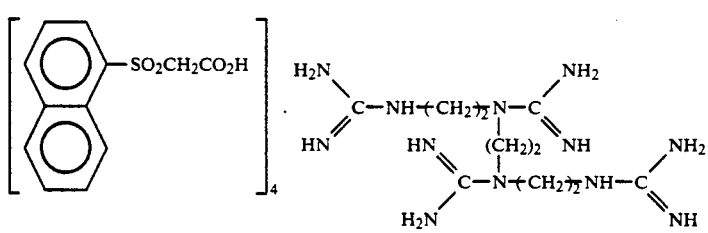 (31)
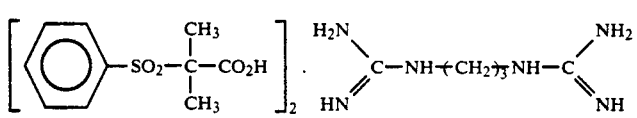 (32)
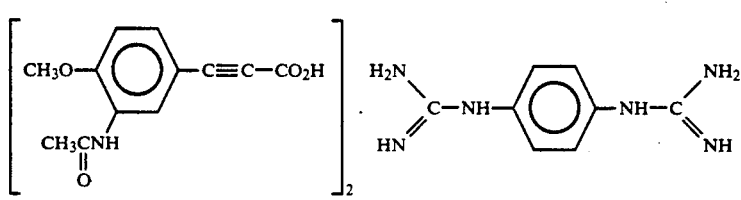 (33)
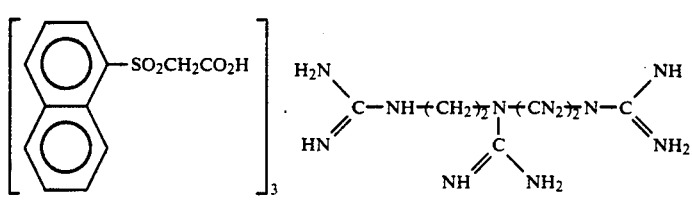 (34)

-continued
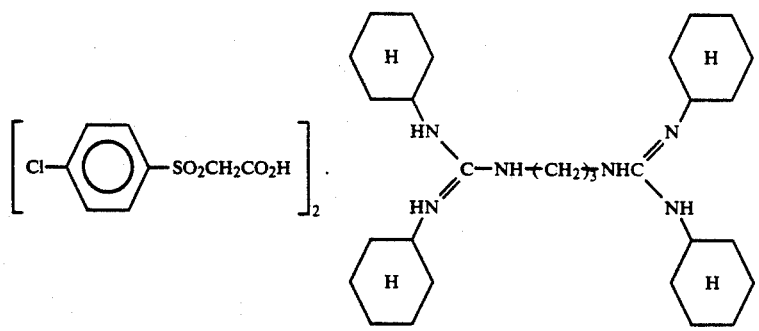 (35)
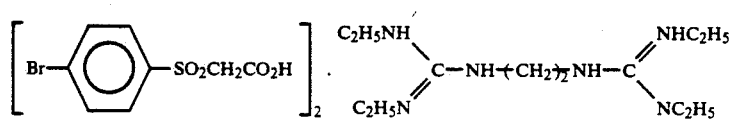 (36)
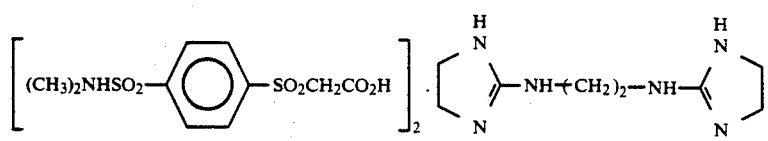 (37)
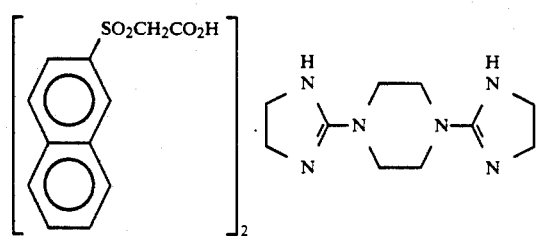 (38)
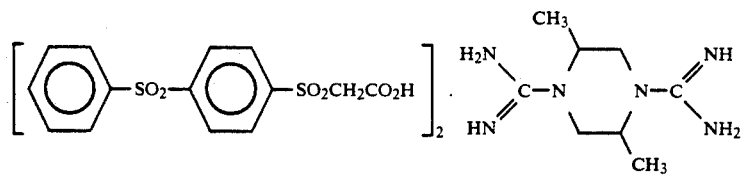 (39)
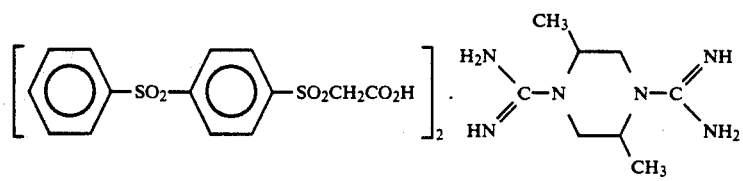 (40)
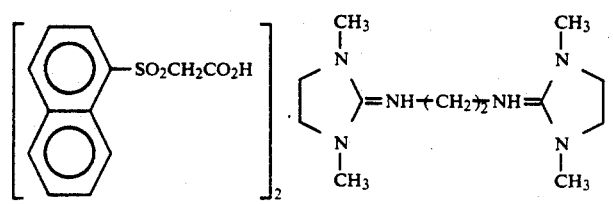 (41)

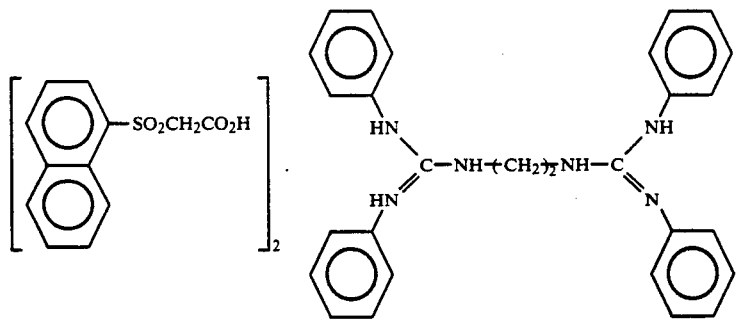
(42)
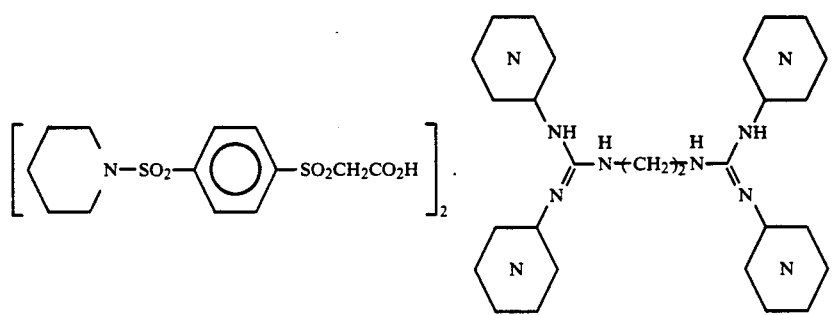
(43)
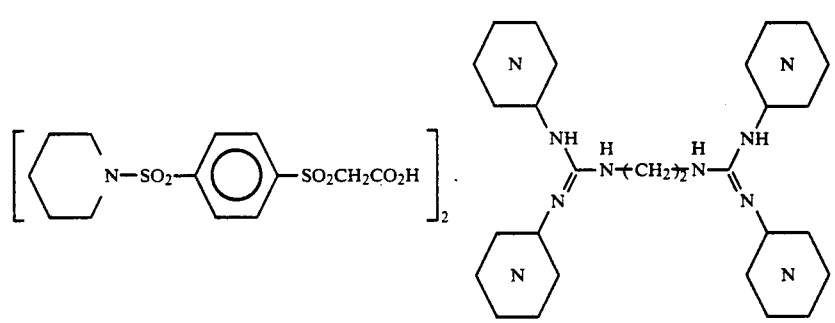
(44)
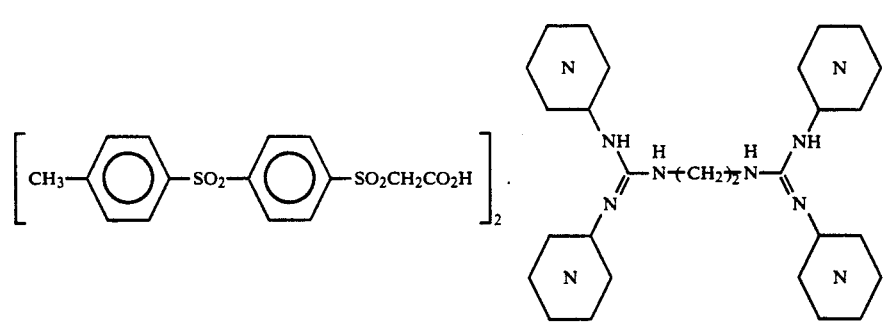
(45)
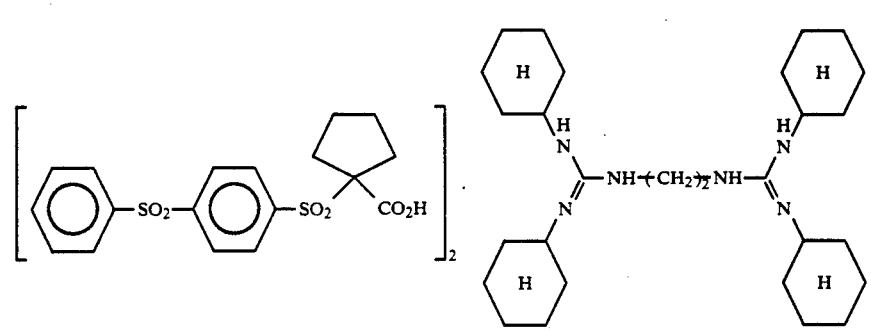
(46)

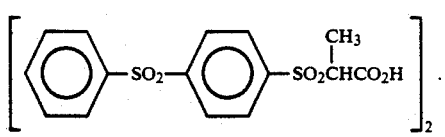 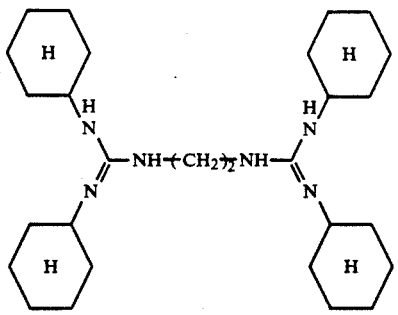 (47)

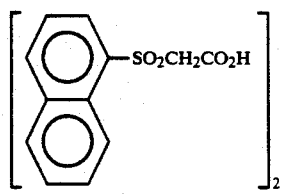 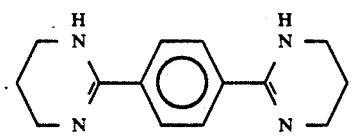 (48)

Synthesis methods of guanidenes are described in "Methoden der Organischen Chemie" (Houbennweyl) 4th edition, 8 (1952), pp. 180-195; and ibid, E4, (1983), pp. 608-624.

The light-sensitive material of the invention preferably contains the above-mentioned base precursor in an amount of not more than 50 weight % of the light-sensitive layer, more preferably 0.01 to 40 weight % of the light-sensitive layer. The base precursor can be used in combination of two or more kind.

The base precursor is preferably contained in light-sensitive microcapsules in the form of dispersion of solid fine particles.

The base precursor can be introduced into the microcapsules by directly dispersing the solid base precursor in the polymerizable compound (as is described in Japanese Patent Provisional Publications No. 64(1989)-32251 and No. (1989)-263641). However, it is preferred to emulsify an aqueous dispersion of the base precursor in a polymerizable compound (as is described in Japanese Patent Provisional Publication No. 63(1988)-218964).

In order to disperse the base precursor into water, it is preferred to use a nonionic or amphoteric water soluble polymer.

Examples of a nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose. The above-mentioned polyethylene oxide compounds can be also used as nonionic polymer.

Examples of an amphoteric water soluble polymer include gelatin.

The amount of the water soluble polymer preferably is in the range of 0.1 to 100 weight. %, more preferably in the range of 1 to 50 weight. %, base on the amount of the base precursor. The amount of the base precursor preferably is in the range of 5 to 60 weight. %, more preferably in the range of 10 to 50 weight. %, base on the amount of the dispersion. Further, the amount of the base precursor preferably is in the range of 2 to 50 weight. %, more preferably in the range of 5 to 30 weight. %, base on the amount of the polymerizable compound.

In the present invention, the color image forming substance is a colored substance such as a dye or a pigment. A pigment is particularly preferred.

As the pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment, and polymeric linking dyestuff. Examples of a pigment include insoluble azo pigment, azolake pigment, condensed azo pigment, chelate azo pigment, phthalocyanine pigment, anthraquinone pigment, perylene and perynone pigment, thioindigo pigment, quinacridone pigment, dioxazine pigment, isoindolinone pigment, quinophthalone pigment, color lake pigment, azine pigment, nitroso pigment, nitro pigment, natural pigment, fluorescent pigment and inorganic pigment.

The pigment particles is preferably surface treated to be lipophilic. The methods of surface treatment include a method having the step of coating with a resin or a wax, a method having the step of attaching of a surface active agent or a method having the step of connecting an active substance (e.g., a silane coupling agent, an epoxy compound and polyisocyanate) onto the surface of the pigment. The methods are disclosed in "Nature and Application of Metallic Soap", Saiwai Shobo (ed.); "Printing Ink Technique", CMC Shuppan (ed. 1984); and "New Application and Technique of Pigment", CMC Shuppan (ed. 1986).

The diameter of the pigment particles preferably is in the range of 0.01 to 10 μm, more preferably 0.05 to 1 μm in the measurement after the particles are dispersed in the polymerizable compound.

Examples of the dye used in the present invention include azo dyes such as; benzene-azo, naphthalene-azo and heterocyclic azo; stilbene dyes; nitro and nitroso dyes; carbonium dyes such as diphenylmethane, triphenylmethane, xanthene and acridine; quinoline dyes; methine dyes such as polymethine and azomethine; thiazole dyes; quinone imine dyes such as azine, oxazine and thiazine; lactone dyes; aminoketone and hydroxyketone dyes; anthraquinone dyes; benzquinone and naphthoquinone dyes; indigoid dyes such as indigo and thioindigo; phthalocyanine dyes; naphthalimide dyes; perinone dyes; and metallic chelate. These dyes are described in Yuki Gosei Kagaku Kyokai (ed.), Handbook of Dyes (written in Japanese, 1970), and Teiji Abeta and Kunihiko Imada, Description of Dye Chemistry (written in Japanese). Azo dyes, azomethine dyes, anthraquinone dyes and phthalocyanine dyes are preferred, since the hue and the stability of these dyes are appropriate for the present invention.

The pigment and the dye is preferably used in an amount of 10 to 60 parts by weight, based on 100 parts by weight of the polymerizable compound.

A silver halide, a reducing agent, a polymerizable compound which are contained together with the polar compound, the base precursor and the dye or pigment in microcapsules are described below.

Examples of the silver halide employable for the light-sensitive material include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than approx. 0.01μ, or may be relatively large sized grains having a grain diameter of projected area up to approx. 10μ. The silver halide emulsion may be a polydispersed emulsion or a monodispersed emulsion described in U.S. Pat. Nos. 3,574,628 and 3,655,394, and U.K. Patent No. 1,413,748.

A tubular grain having an aspect ratio of not less than approx. 5 can be also employed. The tubular silver halide grains can be easily prepared by processes described in Gutoff, "Photographic Science and Engineering, Vol. 14, pp. 248–257 (1970)", U.S. Pat. Nos. 4,434,226, 4,414,310, 4,433,048 and 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22–23 (Dec. 14, 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
| --- | --- | --- |
| Chemical sensitizing agent | p. 23 | p. 648 (right side) |
| Sensitivity-increasing agent | | p. 648 (right side) |
| Spectral sensitizing agent and Supersensitizing agent | p. 23–24 | p. 648 (right side)–p. 649 (right side) |
| Anti-fogging agent and Stabilizer | p. 24–25 | p. 649 (right side) |

It is preferred to use silver halide grains having a relatively low fogging value.

For uniformly incorporating the silver halide into microcapsules, a copolymer composed of a hydrophilic repeating unit and a hydrophobic repeating unit is preferably dissolved in the polymerizable compound.

The reducing agent employable in the light-sensitive material of the invention has a function of reducing the silver halide and/or a function of accelerating (or restraining) polymerization of the polymerizable compound. There are known various reducing agents having the above-mentioned functions. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind, amount of the above reducing agent, the polymerizable compound can be polymerized within the area where a latent image of the silver halide has been formed or has not been formed. In a system wherein the polymerizable compound is polymerized within the area where a latent image of the silver halide has not been formed, 1-phenyl-3-pyrazolidones, hydroquinones and sufonamidephenols are particularly preferred as the reducing agent.

Various reducing agents having the above-mentioned functions (including compounds referred to as developing agent, hydrazine derivative) are described in T. James, "The Theory of the Photographic Process", 4th edition, pp. 291–334 (1977), Research Disclosure Vol. 170, No. 17029, pp. 9–15 (June 1978), and Research Disclosure Vol. 176, No. 17643, pp. 22–31 (Dec. 14, 1978). Further, there can be also employed a reducing agent precursor capable of releasing a reducing agent under heating or in contact with a base. Also in the light-sensitive material of the invention, various reducing agents and reducing agent precursors can be effectively employed. Thus, "the reducing agent(s)" in the present specification means to include all of the reducing agents and reducing agent precursors described in the publications.

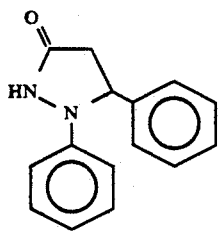 (1)

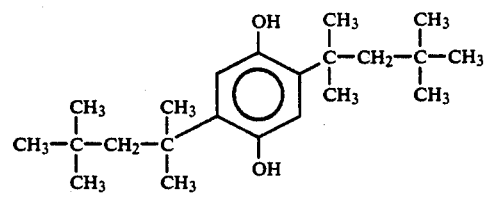 (2)

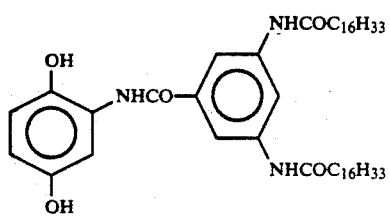 (3)

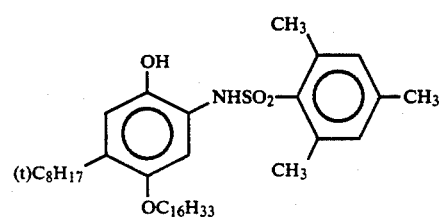 (4)

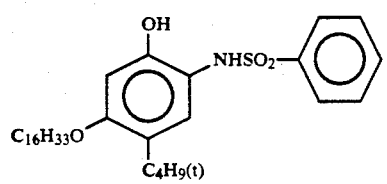 (5)

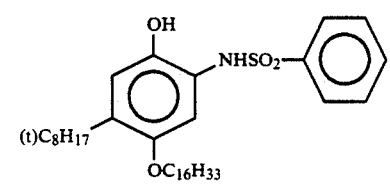 (6)

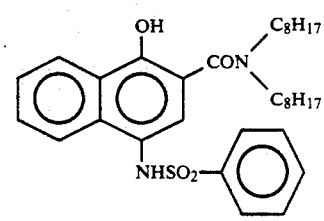 (7)

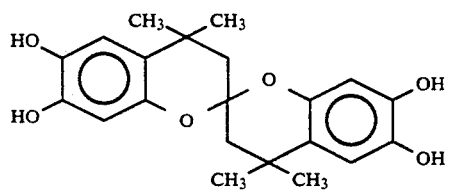 (8)

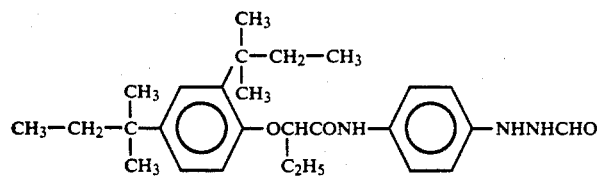 (9)

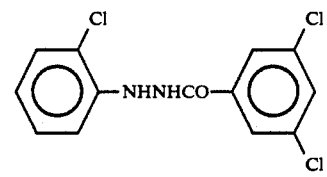 (10)

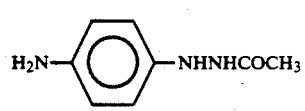 (11)

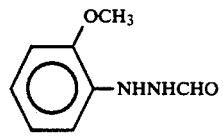 (12)

Among the above-mentioned reducing agents, those having a basic nature, which form an acid and a salt, can be used in the form of a salt of an appropriate acid.

The reducing agents can be used singly or in combination. In the case that two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Concrete example of the above-mentioned reducing agents are as follows.

The reducing agent can be used in the light-sensitive material in an amount of wide range, but generally the amount thereof is in the range of 0.1 to 1,500 mole %, preferably in the range of 10 to 300 mole %, based on the amount of the silver salt.

The polymerizable compounds employable for the light-sensitive material generally are compounds having an ethylenically unsaturated group.

Examples of the compounds having an ethylenic unsaturated group which can be used for the light sensitive material include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl-1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, polymerizable compounds in which a polymerizable functional group such as a vinyl group or a vinylidene group is introduced into a chemical structure of the above-described reducing agent can be also employed as the polymerizable compound.

Microcapsules used in the invention are described below.

There is no specific limitation on the preparation of microcapsules, and any known processes can be employed. Examples of the processes for preparing microcapsules include a process utilizing coacervation of hydrophilic wall-forming materials as described in U.S. Pat. Nos. 2,800,457 and No. 2,800,458; an interfacial polymerization process as described in U.S. Pat. No. 3,287,154, U.K. Patent No. 990,443, and Japanese Patent Publications No. 38(1963)-19574, No. 42(1967)-446 and No. 42(1967)-771; a process utilizing precipitation of polymers as described in U.S. Pat. Nos. 3,418,250 and 3,660,304; a process of using isocyanate polyol wall-materials as described in U.S. Pat. No. 3,796,669; a process of using isocyanate wall-materials as described in U.S. Pat. No. 3,914,511; and a process of using aminoaldehyde resins as described in U.S. Pat. Nos. 4,001,140, 4,087,376, 4,089,802 and 4,025,455, and Japanese Patent Provisional Publications No. 62(1987)-209439, No. 64(1989)-91131 and No. 1(1989) 154140.

Further, examples of the processes for preparing microcapsules include an in situ process utilizing polymerization of monomers as described in Japanese Patent Publication No. 36(1961) 9168 and Japanese Patent Provisional Publication No. 51(1976)-9079; a polymerization dispersing and cooling process as described in U.K. Patents No. 927,807 and No. 965,074; and a spray-drying process as described in U.S. Pat. No. 3,111,407 and U.K. Patent No. 930,422. A process for encapsulating oily droplets of the polymerizable compound is not limited to the above-mentioned ones, but a process of emulsifying core materials and then forming a polymeric membrane as a microcapsule shell over the core material is particularly preferred. Examples of the shell material include a polyamide resin and/or a polyester resin, a polyurea resin and/or a polyurethane resin, gelatin, an epoxy resin, a complex resin containing a polyamide resin and a polyurea resin, a complex resin containing a polyurethane resin and a polyester resin.

Examples of amino-aldehyde resins include urea-formaldehyde resins, urea-formaldehyde-resorcinol resins, melamine formaldehyde resins, acetoguanamine-formaldehyde resins and benzoguanamine-formaldehyde resins. A melamine-formaldehyde resin, of which fine microcapsules can be made, is particularly preferred in the invention.

The microcapsule having a polymer shell of a polymeric compound around a film composed of a reaction product of a water-soluble polymer having a sulfinyl group and a polymerizable compound having an ethylenic unsaturated group is preferred.

In the case that aminoaldehyde resins are used for microcapsules, the amount of residual aldehyde is preferably regulated to be below a certain value.

A mean grain size of microcapsules is preferably within the range of 3 to 20 $\mu$m. It is preferred that the grain sizes of microcapsules be homogeneously dispersed in the range above a certain value. The ratio between the thickness and the grain size of a microcapsule is preferably within a certain range.

In the case that a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case that a silver halide is contained in microcapsules, the silver halide is preferably contained within the shell of the microcapsule.

When a shell of a microcapsule is formed by dispersing an oily liquid containing a base precursor and a dye or pigment to an aqueous medium in the process for preparing the light-sensitive microcapsules, a nonionic water soluble polymer is preferably contained in the aqueous medium. The amount of oily liquid is preferably within the range of 10 to 120 weight. %, more preferably 20 to 90 weight. %, based on the amount of the aqueous medium.

Examples of a nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methyl cellulose.

In order to disperse a hydrophobic core material containing the oily liquid finely and effectively to the aqueous medium, it is preferred to use an anionic water soluble polymer together with a nonionic water soluble polymer. In this case, the concentration of the anionic water soluble polymer in the aqueous medium is preferably within a range of 0.01 to 5 weight. %, more preferably 0.1 to 2 weight. %.

Examples of an anionic water soluble polymer include polystyrenesulfinic acid, co-polymer of styrenesulfinate, polystyrenesulfonate, co-polymer of styrenesulfonic acid, polyvinylsulfuric acid ester, polyvinylsulfonate, maleic anhydride-styrene co-polymer and maleic anhydride-isobutyrene co-polymer.

In the above-described case, it is particularly preferred to use a water soluble polymer having a few sulfinic groups together with a nonionic water soluble polymer.

There is no specific limitation with respect to the support employable in the invention, but it is preferred to use materials which are resistant to temperatures given in the developing stage as the support material.

Examples of the materials employable for the preparation of the support include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

Optionally employable components contained in a light-sensitive layer and optional layers included in a light-sensitive material are described below.

Examples of an optionally employable component contained in a light-sensitive layer include an organometallic salt, various image formation accelerators, a thermal polymerization preventive, a development terminator, a fluorescence whitening agent, a decoloring preventive, a dye or a pigment to prevent halation and irradiation, a coloring matter having a property of being decolored by heating or irradiation with light, a matte agent, a smudge preventive, a plasticizer, a water releasing agent, a binder, a hardening agent, a coating additive, an antistatic agent, a solvent of a polymerizable compound and a water soluble vinyl An organometallic salt can be used as an oxidizing agent in combination with silver halide in the invention. An organic silver salt is most preferably employed.

Examples of an organic compound employable for forming such organosilver salt oxidizing agent include benzotriazoles, aliphatic acids and other compounds described in U.S. Pat. No. 4,500,626 (pp. 52-53). Also effectively employable are silver salts of carboxylic acids having alkynyl group (e.g., silver phenylpropionate) and acetylene silver salt. The organic silver salts can be used singly or in combination of two or more kinds.

The above-mentioned organic silver salt can be used in combination with a light-sensitive silver halide in an amount of 0.01 to 10 mole, preferably 0.01 to 1 mole, per 1 mole of the silver halide. The total amount of the organic silver salt and the silver halide is generally within a range of 1 mg/m$^2$-10 g/m$^2$ in terms of the amount of silver metal.

Various image formation accelerators is employable for the light-sensitive material.

Image formation accelerators have the functions such as 1) accelerating the transfer of a base or a base precursor, 2) accelerating the reaction of a reducing agent and a silver salt, 3) accelerating the passivating reaction of coloring substances by polymerization. From a viewpoint of physical chemistry concerning the functions, the image formation accelerators can be classified into base or base precursor nucleophilic compounds, oils, heat solvents, sur face active agents, compounds having interactions with silver or silver salts, compounds having deoxidization function and other compounds. However, these substances generally have complex functions, so each of them usually has some acceleration effects described above.

Various development terminators can be employable for the light-sensitive materials in order to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration in or der to terminate the development. Concrete examples of a development terminator include a acid precursor which emits an acid by heating, an electrophilic compound which substitutes a chlorine atom existing together with by heating, a nitrogen-including heterocyclic compound, a mercapto compound and a precursor thereof.

In order to prevent halation and irradiation, a dye or a pigment may be added to the light-sensitive layer of the light-sensitive materials.

In the case that microcapsules are contained in the light-sensitive layer of the light-sensitive material, the microcapsules may contain a coloring matter having a property of being decolored by heating or irradiation with light. The coloring matter having a property of being decolored by heating or irradiation with light can play the role corresponding to yellow filter in the conventional silver salt photography system.

The antismudging agent employable for the light-sensitive material is preferably used in form of solid grains at room temperature. Concrete examples of the antismudging agent employable for the light-sensitive material include starch grains described in U.K. Patent No. 1,232,347, fine powder of polymer U.S. Pat. No. 3,625,736, microcapsules containing no color developing agent described in U.K. Patent No. 1,235,991, fine powder of cellulose described in U.S. Pat. No. 2,711,357 and inorganic grains such as talc, kaolin, bentonite, pagodite, zinc oxide, titanium oxide, alumina. A mean grain size of the above-mentioned grains is preferably within the range of 3 to 50 $\mu$m, more preferably 5 to 40 $\mu$m, in terms of volume mean diameter. It is effective that the size of the grain is larger than that of the microcapsule.

The binder employable for the light-sensitive material can be included in the light-sensitive layer singly or in combination. A water-soluble binder is preferably employed. A typical water-soluble binder is transparent or semi-transparent one, of which examples include natural substances such as gelatin, gelatine derivatives, cellulose derivatives, starch and gum arabic; and synthetic polymer substances such as polyvinyl alcohol, polyvinyl pyrrolidone and water-soluble polyvinyl compound (e.g., acrylamide polymer). One of the other examples of synthetic polymer substances is a dispersing vinyl compound which increases the size-stability of photographic materials in form of latex.

In the case that gelatin is employed as a binder of the light-sensitive material, various hardening agents are employable. Concrete examples include aldehyde type hardening agents, aziridine type hardening agents, epoxy type hardening agents, vinylsulfonate type hardening agents, N-methylole type hardening agents and polymer type hardening agents.

Various surface active agents are employable for the light-sensitive material for various purpose, such as aiding the coating process, increasing facility of peeling off, increasing slipperiness, preventing electrification and accelerating development.

An antistatic agent is employable for the light-sensitive materials in order to prevent electrifying. Antistatic agents are described in Research Disclosure Vol. 176, No. 17643, pp. 27 (November, 1978).

In the case that a solvent of a polymerizable compound is used for the light-sensitive material, the solvent is preferably contained in microcapsules other than those containing polymerizable compound. Silver halide grains adsorbing water soluble vinyl polymer can be also employed.

Examples of an optional layer provided in a light-sensitive material include an image-receiving layer, a heating layer, an anti-electrifying layer, an peeling layer, a cover sheet or a protective layer, a layer containing a base or a base precursor, a layer of base barrier and an anti-halation layer (a coloring layer).

When the light-sensitive material is used, the image may be formed on the above-mentioned image-receiving layer provided on the light-sensitive material, instead of using an image-receiving material (described later). An image-receiving layer provided on the light-sensitive material can have the same constitution as that on an image-receiving material. The detail of the image-receiving layer is described below.

The value of pH in the light-sensitive layer of the invention is preferably not more than 7. The value of pH in the light sensitive layer preferably is not elevated by heating.

Using the light-sensitive material of the invention, and image can be formed on an image-receiving material. The image-receiving material is described below.

As a support of an image-receiving material, not only the above-described support of a light-sensitive material but also baryta paper can be employed. In the case that a porous material such as paper is used as a support of an image-receiving material, the surface of the material preferably has a certain smoothness.

A image-receiving material generally comprises a support and an image-receiving layer provided thereon. The image-receiving layer can be desirably constituted with various compounds, depending upon color developing system of the above-mentioned color image forming substances and other conditions. In the present invention, a dye or pigment is used as an color image forming substances. Therefore, the image-receiving material may comprise a support alone.

The image-receiving layer can comprise at least one layer including a mordanting agent. The mordanting agent can be selected from the compounds known in the field of photographic technology. If necessary, an image-receiving layer may comprise two or more layers using plural mordanting agents of which mordantabilities are different each other.

An image-receiving layer of an image-receiving material comprises a white pigment, a binder and other additives. A white pigment itself or space among the white pigment grains enhances the acceptability of a polymerizable compound.

Examples of the white pigment employable for an image-receiving layer include inorganic white pigments such as oxides (e.g., silicon oxide, titanium oxide, zinc oxide, magnesium oxide and aluminium oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminium silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine formalin resin and polyamide resin. The white pigment above-described can be used in the invention singly or in combination. A white pigment which can absorb a high amount of a polymerizable compound is preferably used.

A mean grain size of the white pigment is within a range of 0.1 to 20 $\mu$m, preferably 0.1 to 10 $\mu$m. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

An image-receiving layer preferably includes polymer as a binder. The binders employable for a light-sensitive layer of a light-sensitive material are also used in the image-receiving layer. A polymer having a low transmission coefficient of oxygen can be used as the binder.

A thermoplastic compound may be contained in the image-receiving layer. In the case that the thermoplastic compound is contained in the image-receiving layer, the image-receiving layer itself is preferably composed of an agglomerate of fine particles of the thermoplastic compound.

The photopolymerization initiator or the thermal polymerization initiator may be contained in an image-receiving layer.

According to the functions above described, an image-receiving layer may comprise two or more layers. The thickness of an image-receiving layer is preferably in the range of 1 to 100 $\mu$m, and more preferably 1 to 20 $\mu$m.

A protective layer may be also provided on an image-receiving layer. Further, a layer composed of an agglomerate of fine particles of the thermoplastic compound may be provided on an image-receiving layer.

A polymer image can be obtained on the image-receiving material by pressing the light-sensitive material on the image-receiving material, after development to transfer the unpolymerized polymerizable compound with the dye or pigment to the image-receiving material.

For applying a pressure to the light-sensitive material and the image-receiving material, any known pressing methods can be employed.

After an image is formed on the image-receiving material by the above process, the image-receiving material may be heated. The heated image can be improved in the stability since the unpolymerized polymerizable compound is polymerized.

Use of the light-sensitive material is described below.

In the use of the light-sensitive material, the light-sensitive material is subjected to development process simultaneously with or after imagewise exposure.

Various exposure means can be employed in the image-wise exposure, and in general, the light-sensitive material is imagewise exposed to a radiation including visible light to obtain a latent image of the silver halide. The kind of light source or the amount of light employed in the exposure can be selected depending on a light-sensitive wavelength (or intensified wavelength in the case of spectral sensitization) of the silver halide and a sensitivity of the light-sensitive material. An original image can be either monochromatic image or color image.

Development of the light-sensitive material can be conducted simultaneously with or after the imagewise exposure.

The light-sensitive material may be subject to a development treatment using the developing agent. However, a heat development process is a dry treatment, so it is simple and needs short time to be carried out. Therefore, the latter process is particularly preferred.

Heating in the heat development process can be conducted in various known manners. For example, a heating layer which is arranged on the light-sensitive material can be used as the heating means. The heat development process may be conducted under suppressing the amount of oxygen existing in the light-sensitive layer. The temperature for the heat development process usually ranges from 50° C. to 200° C., preferably from 60° C. to 150° C. The heating time is usually not shorter than 1 second, preferably from 1 second to 5 minutes, more y from 1 second to 1 minute.

The development process may be conducted by heating at a temperature of not lower than 50° C. under the condition that the light-sensitive layer contains a liquid in an amount of 10 to 400 weight. % based on the amount of the polymerizable compound.

A color image can be obtained on the image-receiving material by pressing the light-sensitive material on the image-receiving material to transfer the unpolymerized polymerizable compound with the dye or pigment to the image-receiving material.

For applying a pressure to the light-sensitive material and the image-receiving material, any known pressing methods can be employed.

For example, the light-sensitive material and the image-receiving material are sandwiched between press plates such as a presser or transferred using a pressure roller such as a nip roll, to apply a pressure to them. A dot-impact device can be also employed to intermittently give a pressure to them. Otherwise, a pressure may be applied to the light-sensitive material and the image-receiving material by spraying a high-pressure air by means of an air gun or using a ultrasonic wave-generating device or a piezoelectric element.

The light-sensitive material of the invention can be used for color photography, printing and copy (e.g., computer-graphic hard copy).

The present invention is further described by the following examples, but those examples are given by no means to restrict the invention.

EXAMPLE 1

Preparation of Silver Halide Emulsion (EG-1)

In 1,600 ml of water were dissolved 20 g of gelatin and 0.5 g of sodium chloride, and the resulting gelatin solution was adjusted to pH 3.2 using 1N-sulfuric acid and was kept at 42° C. To the gelatin solution, 200 ml of an aqueous solution containing 71 g of potassium bromide and 200 ml of an aqueous solution containing 100 g of silver nitrate were added simultaneously at the same feed rate over 30 minutes. After 1 minute, to the resulting mixture was added 480 mg of the sensitizing dye (SG-1), and after 10 minutes, to the resulting mixture were further added 100 ml of an aqueous solution containing 2.9 g of potassium iodide and 100 ml of an aqueous solution containing 3 g of silver nitrate at the same feed rate over 5 minutes. To the resulting emulsion was then added 1.2 g of polyisobutylene/monosodiumaleate copolymer. After the emulsion was washed with water for desalting, 4.5 g of gelatin was added to the emulsion. Then, to the emulsion was further added 0.7 mg of sodium thiosulfate to chemically sensitize the emulsion at 60° C. for 15 minutes. Thus, a silver halide emulsion (EG-1) (tetradecahedron silver iodobromide monodispersed emulsion, yield: 460 g, fluctuation coefficient: 21%) having a mean grain size of the silver iodobromide of 0.12 μm was prepared.

Sensitizing dye (SG-1)

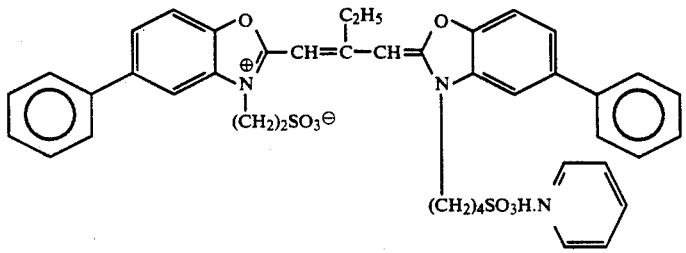

Preparation of Light-Sensitive Composition (PG-1)

To 38.3 g of the polymerizable compound (MN-1) were dissolved 9 g of a 20% (SV-1) solution of the following copolymer (1P-1) and 11.7 g of the color image forming substance (RM-1). To the resulting solution, 2.3 g of (RD-1), 3.2 g of (RD-2) and 0.005 g of the following mercapto compound were added to prepare an oily solution. To the resulting solution, 4.5 g of the silver halide emulsion (EG-1), 24 g of the following solid dispersion (KB-1) and 5 g of polyethylene glycol (molecular weight: 2000, available from Wako Junyaku Co. Ltd.) were added, and the resulting mixture was stirred at 15,000 r.p.m. for 5 minutes at 60° C. using a homogenizer to obtain a light-sensitive composition (PG-1) in the form of a W/O emulsion.

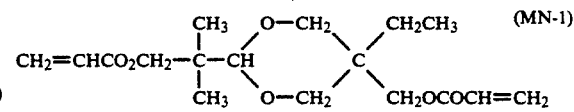

(tradename: Kayarad R-604, available from Nippon Kayaku Co., Ltd.)

Copolymer

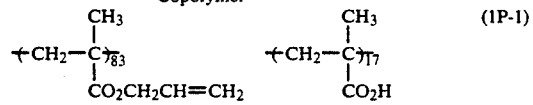

-continued

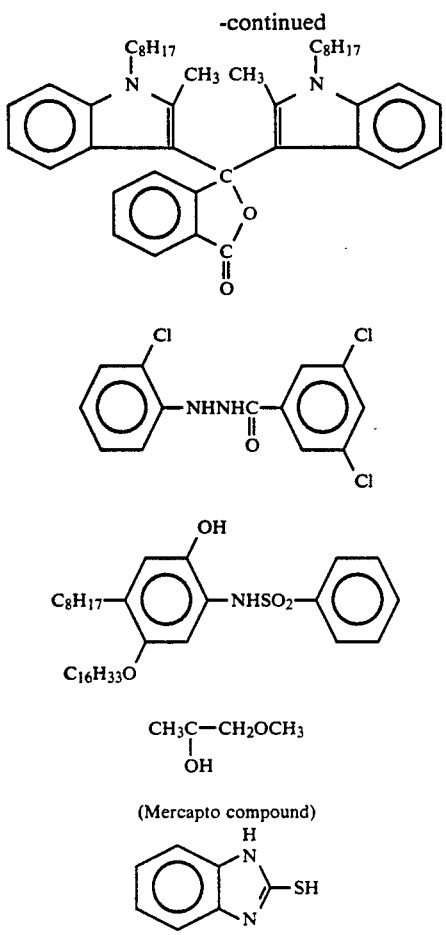

(RM-1)

(RD-1)

(RD-2)

(SV-1)

(Mercapto compound)

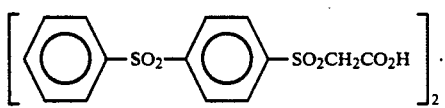

Preparation of Solid Dispersion (KB-1)

To a 300 ml dispersion container were added 84 g of a 10% aqueous solution of gelatin, 46 g of water, 70 g of the base precursor (43) and 200 ml of glass beads of which diameters were within a range of 0.5–0.75 mm. The resulting mixture was stirred at 3,000 r.p.m. for 30 minutes using a Dynomill to obtain a solid dispersion (KB-1) of the base precursor (43) of which grain size was not more than 1.0 μm.

Base precursor (43)

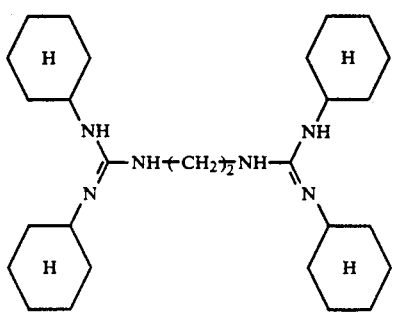

Preparation of Microcapsule Dispersion (CG-1)

126 g of a 10% aqueous solution of polyvinyl pyrrolidone (tradename: K-90, available from Wako Junyaku Co., Ltd.), 5.6 g of a 15% aqueous solution of potassium polyvinylbenzene sulfinate and 8.5 g water are mixed and well stirred. The resulting mixture was adjusted to pH 5.0. The light-sensitive component obtained above (PG-1) was added to the mixture and the resulting mixture was stirred at 3,000 r.p.m. for 20 minutes at 60° C. using a homogenizer to obtain a W/O/W emulsion.

Independently, to 13.2 g of melamine were added 17.8 g of a 37% aqueous solution of formaldehyde and 68 g of distilled water, and the resulting mixture was stirred at 60° C. for 30 minutes to obtain a transparent melamineformaldehyde precondensate.

To 146 g of the above-prepared W/O/W emulsion were added 37.5 g of the precondensate and 7.5 g of water, and the resulting mixture was adjusted to pH 5.0 using a 10% aqueous solution of sulfuric acid under stirring. The mixture was then heated to 60° C. and stirred for 120 minutes. Further, to the mixture was added 11 g of a 40% aqueous solution of urea to remove formaldehyde remaining in the microcapsule dispersion, and the mixture was adjusted to pH 3.5 using a 10% aqueous solution of sulfuric acid, and then stirred for 40 minutes. After the reaction was completed, the mixture was adjusted to pH 6.5 using a 10% aqueous solution of sodium hydroxide, and then cooled. Thus, a light-sensitive microcapsule dispersion (CG-1) containing microcapsules having a melamine-formaldehyde resin shell was obtained.

Preparation of Light-Sensitive Material (1)

To 36 g of the above-obtained light-sensitive microcapsule dispersion (CG-1) were added 0.2 g of a surface active agent (tradename: Emalex NP-8, available from Nippon Emulsion Co., Ltd.), 10 g of a 10% aqueous solution of polyvinyl alcohol (tradename: PVA-205, available from Kurare Co., Ltd.) and water, to prepare 74 g of a coating solution for the formation of a light-sensitive layer.

The coating solution was coated over a polyethylene terephthalate film (thickness: 100 μm) in an amount of 57 g/m$^2$, and the coated layer of the solution was dried at approx. 50° C. for 1 hour to prepare a light-sensitive material (A).

Preparation of Image-Receiving Material (1)

To 125 g of water was added 11 g of a 40% aqueous solution of sodium hexametaphosphate, and to the resulting mixture was further added a mixture of 34 g of zinc 3,5-di-α-methylbenzilsalicylate and 82 g of a 55% slurry of calcium carbonate, followed by coarsely dispersing in a mixer. The resulting coarse dispersion was then finely dispersed in Dynomill dispersing device.

More than 1 kg of the solid dispersion A was prepared by repeating the above-mentioned process.

To 1,000 g of the solid dispersion A, 611 g of an 8% aqueous solution of polyvinyl alcohol (tradename: PVA.205, available from Kurare Co., Ltd.) was added.

Independently, 348 g of calcium carbonate (tradename: PC700, available from Shiraishi Industrial Co., Ltd.), 7.18 g of a 40% aqueous solution of acrylic acid-maleic acid copolymer and 1,000 ml of water were mixed. The resulting mixture was stirred at 2,000 r.p.m. for 20 minutes using polytoron dispersing device (tradename: PT 10/35, available from Kinematica Co., Ltd.).

The above-described mixture and the dispersion containing calcium carbonate were mixed. To the resulting mixture was added a dispersion obtained by stirring a mixture of 14 g of zinc chloride and 125 g of a 8% aqueous solution of polyvinyl alcohol (tradename: PVA-205, available from Kurare Co., Ltd.) at 1,000 r.p.m. for 3 minutes using a homogenizer, and then 253 g of a 10% aqueous solution of gelatin and 325 g of water were added.

The coating solution was coated over a paper having a basis weight of 55 g/m² in an amount of 102 cc/m², and the coated layer of the solution was dried at approx. 100° C. to prepare a image-receiving material (1).

EXAMPLE 2

The procedure for preparing the light-sensitive composition (PG-1) in Example 1 was repeated except for adding the same amount of polyethylene glycol (molecular weight: 2,000, available from Wako Junyaku Co. Ltd.) to the oily solution instead of adding to the aqueous solution, to prepare a light-sensitive composition (PG-1). Using the obtained light sensitive composition (PG-1), a light-sensitive material (2) was prepared in the same manner as described in Example 1.

EXAMPLE 3

The procedure for preparing the light-sensitive composition (PG-1) in Example 1 was repeated except for using the same amount of polyethylene glycol (molecular weight: 400, available from Wako Junyaku Co. Ltd.) instead of using polyethylene glycol (molecular weight: 2,000, available from Wako Junyaku Co. Ltd.) to prepare a light-sensitive composition (PG-3). Using the obtained light-sensitive composition (PG-3), a light-sensitive material (3) was prepared in the same manner as described in Example 1.

EXAMPLE 4

The procedure for preparing the light sensitive composition (PG-2) in Example 2 was repeated except for using the same amount of octanediol (available from Wako Junyaku Co. Ltd.) instead of using polyethylene glycol (molecular weight: 2,000, available from Wako Junyaku Co. Ltd.) to prepare a light-sensitive composition (PG-4). Using the obtained light-sensitive composition (PG-4), a light-sensitive material (4) was prepared in the same manner as described in Example 2.

EXAMPLE 5

The procedure for preparing the light-sensitive composition (PG-2) in Example 2 was repeated except for using the same amount of stearyl alcohol (available from Wako Junyaku Co. Ltd.) instead of using polyethylene glycol (molecular weight: 2,000, available from Wako Junyaku Co. Ltd.) to prepare a light-sensitive composition (PG-5). Using the obtained light-sensitive composition (PG-5), a light-sensitive material (5) was prepared in the same manner as described in Example 2.

EXAMPLE 6

The procedure for preparing the light-sensitive composition (PG-2) in Example 2 was repeated except for using the same amount of stearic amide (available from Wako Junyaku Co. Ltd.) instead of using polyethylene glycol (molecular weight: 2,000, available from Wako Junyaku Co. Ltd.) to prepare a light-sensitive composition (PG-6). Using the obtained light-sensitive composition (PG-6), a light-sensitive material (6) was prepared in the same manner as described in Example 2.

EXAMPLE 7

The procedure for preparing the light-sensitive composition (PG-1) in Example 1 was repeated except for using the following solid dispersion (KB-2) of the base precursor (48) instead of using the solid dispersion (KB-1) of the base precursor (43) to prepare a light-sensitive composition (PG-7). Using the obtained light-sensitive composition (PG-7), a light-sensitive material (7) was prepared in the same manner as described in Example 1.

Base precursor (48)

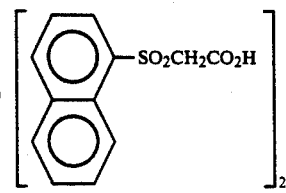

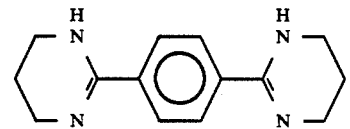

COMPARISON EXAMPLE 1

The procedure for preparing the light-sensitive composition (PG-1) in Example 1 was repeated except for using 5 g of water instead of using 5 g of polyethylene glycol (molecular weight: 2,000, available from Wako Junyaku Co. Ltd.) to prepare a light-sensitive composition (PG-8). Using the obtained light-sensitive composition (PG-8), a light-sensitive material (8) for comparison was prepared in the same manner as described in Example 1.

COMPARISON EXAMPLE 2

The procedure for preparing the light-sensitive composition (PG-7) in Example 7 was repeated except for using 5 g of water instead of using 5 g of polyethylene glycol (molecular weight: 2,000, available from Wako Junyaku Co. Ltd.) to prepare a light-sensitive composition (PG-8). Using the obtained light-sensitive composition (PG-8), the light-sensitive material (9) for comparison was prepared in the same manner as described in Example 7.

Each of the light-sensitive materials obtained in Examples 1-7 and Comparison Examples 1 and 2 was evaluated in the following manner, immediately after preparing and after having been left in an oven at 50° C. for 3 days. The light-sensitive material was imagewise exposed to light at 2,000 lux for 1 second using a tungsten lamp over a continuous filter having a transmission density of 0-4.0, and then heated on a hot plate at 135° C. or 150° C. for 15 seconds. Thereafter, the light-sensitive material was superposed on the image-receiving material in such a manner that the light-sensitive layer faced the image-receiving layer, and they were passed through a pressure roller having a pressure of 500 kg/cm². Then the light-sensitive material was separated from the image-receiving material.

The following CN value was calculated from the maximum density $D_{max}$ (corresponding to the unexposed portion) and the minimum density $D_{min}$ (corresponding to the exposed portion) of the transferred image of magenta obtained on the image-receiving material.

CN value = $D_{max}/D_{min}$ (A large CN value means that the obtained image has high contrast.)

The results are set forth in Table 1.

TABLE 1

| Light-Sensitive Material | Additives | Base Precursor | Development Condition | CN Value immediately after prep. | CN Value after 3 days at 50° C. |
|---|---|---|---|---|---|
| (1) | PEG 2,000 | (43) | 135° C./15 sec. | 9.06 | 7.83 |
| (2) | PEG 2,000 | (43) | 135° C./15 sec. | 9.02 | 7.81 |
| (3) | PEG 400 | (43) | 135° C./15 sec. | 9.03 | 7.22 |
| (4) | Octanediol | (43) | 135° C./15 sec. | 8.75 | 7.18 |
| (5) | Stearyl alcohol | (43) | 135° C./15 sec. | 9.12 | 7.95 |
| (6) | Stearic amide | (43) | 135° C./15 sec. | 9.01 | 7.72 |
| (7) | PEG 2,000 | (48) | 150° C./15 sec. | 5.23 | 3.20 |
| (8) | None | (43) | 135° C./15 sec. | 9.15 | 1.08 |
| (9) | None | (48) | 150° C./15 sec. | 6.20 | 1.02 |

Remark: PEG 2,000 and 400 mean polyethylene glycols having average molecular weights of 2,000 and 400 respectively.

As is evident from the above results, the light-sensitive material of the invention has considerably improved stability for storage, so it can present a high contrast image even after having been left at 50° C. for 3 days.

EXAMPLE 8

Preparation of Silver Halide Emulsion (EB-1)

In 1,500 ml of water were dissolved 16 g of gelatin and 0.5 g of sodium chloride, and the resulting gelatin solution was adjusted to pH 3.2 using 1N-sulfuric acid and was kept at 50° C. To the gelatin solution, 300 ml of an aqueous solution containing 71 g of potassium bromide and 300 ml of an aqueous solution containing 100 g of silver nitrate were added simultaneously at the same feed rate over 50 minutes. After 1 minute, to the resulting mixture was added 430 mg of the sensitizing dye (SB-1), and after 15 minutes, to the resulting mixture were further added 100 ml of an aqueous solution containing 2.9 g of potassium iodide and 100 ml of an aqueous solution containing 3 g of silver nitrate at the same feed rate over 5 minutes. To the resulting emulsion was then added 1.2 g of polyisobutylene/monosodium maleate copolymer. After the emulsion was washed with water for desalting, 4 g of gelatin was added to the emulsion. Then, to the emulsion was further added 0.5 mg of sodium thiosulfate to chemically sensitize the emulsion at 50° C. for 15 minutes. Thus, a silver halide emulsion (EB-1) (tetradecahedron silver iodobromide-monodispersed emulsion, yield: 460 g, fluctuation coefficient: 20%) having a mean grain size of the silver iodobromide of 0.22 μm was prepared.

Sensitizing dye (SB-1)

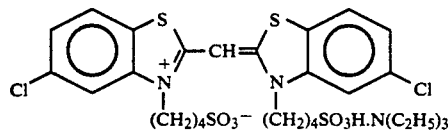

Preparation of Pigment Dispersion (GY-1)

To 270 g of the polymerizable compound (MN-1) was added 30 g of microlithyellow 4GA (tradename, available from Ciba-Geigy). The resulting mixture was pulverized for hour at 5,000 r.p.m. using Eiger motor mill (produced by Eiger Engineering Co., Ltd.), to prepare a dispersion (GY-1).

Preparation of Light-Sensitive Composition (PB-1)

To 45 g of the pigment dispersion (GY-1) was dissolved 9 g of a 20 wt. % (SV-1) solution of copolymer (1P-1). To the resulting solution, 2.3 g of (RD-1), 3.1 g of (RD-2) and 0.005 g of the above mercapto compound were added to prepare an oily solution. To the resulting solution, 4.5 g of the silver halide emulsion (EB-1), 24 g of the solid dispersion (KB-1) and 5 g of polyethylene glycol (molecular weight: 2000, available from Wako Junyaku Co. Ltd.) were added, and the resulting mixture was stirred at 15,000 r.p.m. for 5 minutes at 60° C. using a homogenizer to obtain a light-sensitive composition (PB-1) in the form of a W/O emulsion.

Preparation of Microcapsule Dispersion (CB-1)

A mixture of 4 g of a 15% aqueous solution of potassium polyvinylbenzensulfinate, 70 g of a 10% aqueous solution of polyvinyl pyrrolidone K-90 (available from GAF) and 26 g of distilled water was adjusted to pH 5.0. The light-sensitive component obtained above (PB-1) was added to the mixture and the resulting mixture was stirred at 5,000 r.p.m. for 20 minutes at 60° C. using a dissolver to obtain a W/O/W emulsion.

Independently, to 14.8 g of melamine were added 20 g of a 37% aqueous solution of formaldehyde and 76.3 g of distilled water, and the resulting mixture was stirred at 60° C. for 40 minutes to obtain a aqueous solution of transparent melamine-formaldehyde precondensate.

To 146 g of the above-prepared W/O/W emulsion were added 37.5 g of the aqueous solution of precondensate and 7.5 g of water, and the resulting mixture was adjusted to pH 5.0 using a 10% aqueous solution of sulfuric acid. The mixture was then heated to 60° C. and stirred for 60 minutes. Further, to the mixture was added 10 g of a 40% aqueous solution of urea, and then stirred for 40 minutes at 60° C. After the reaction was completed, the mixture was adjusted to pH 6.5 using a 10% aqueous solution of sodium hydroxide. Thus, a light-sensitive microcapsule dispersion (CB-1) containing microcapsules having a melamine-formaldehyde resin shell was obtained.

Preparation of Light-Sensitive Material (10)

To 31 g of the above-obtained light-sensitive microcapsule dispersion (CB-1) were added 0.2 g of the above surface active agent (tradename: Emalex NP-8, available from Nippon Emulsion Co., Ltd.), 10 g of a 10% aqueous solution of polyvinyl alcohol (tradename: PVA 205, available from Kurare Co., Ltd.) and water, to prepare 74 g of a coating solution for the formation of a light-sensitive layer.

The coating solution was coated over a polyethylene terephthalate film (thickness: 100 μm) in an amount of 114 g/m², and the coated layer of the solution was dried at approx. 50° C. for 1 hour to prepare a light-sensitive material (10).

Preparation of Image-Receiving Material (2)

A mixture of 77.1 g of calcium carbonate (tradename: PC700, available from Shiraishi Industrial Co., Ltd.), 1.6 g of a surface active agent (poize 520, available from Kao Co., Ltd.) and 221.4 ml of water was stirred at 2,000 r.p.m. for 20 minutes using polytoron dispersing device (tradename: PT 10/35, available from Kinematica Co., Ltd.). To 71 g of the resulting dispersion was added 34.5 g of a 8 aqueous solution of polyvinyl alcohol (tradename: PVA. 205, available from Kurare Co., Ltd.), and then 28.5 g of water were added to prepare a coating solution for an image-receiving layer.

The coating solution was coated over a paper having a basis weight of 55 g/m² (i.e., a paper having a fiber length distribution [defined by JIS-P-8207] in which the sum of weight percent of 24 mesh residue and 42 mesh residue is within a range of 30.60%, as described in Japanese Patent Provisional Publication No. 63(1988) in an amount of 102 cc/m², and the coated layer of the solution was dried at approx. 60° C. to prepare an image-receiving material (2).

EXAMPLE 9

The procedure for preparing the light-sensitive composition (PB-1) in Example 8 was repeated except for adding the same amount of polyethylene glycol (molecular weight: 2,000, available from Wako Junyaku Co. Ltd.) to the oily solution instead of adding to the aqueous solution, to prepare a light-sensitive composition (PB-2). Using the obtained light-sensitive composition (PB-2), a light-sensitive material (11) was prepared in the same manner as described in Example 8.

EXAMPLE 10

The procedure for preparing the light-sensitive composition (PB-1) in Example 8 was repeated except for using the same amount of polyethylene glycol (molecular weight: 400, available from Wako Junyaku Co. Ltd.) instead of using polyethylene glycol (molecular weight: 2,000, available from Wako Junyaku Co. Ltd.) to prepare a light-sensitive material (12).

EXAMPLE 11

The procedure for preparing the light-sensitive composition (PB-2) in Example 9 was repeated except for using the same amount of octanediol (available from Wako Junyaku Co. Ltd.) instead of using polyethylene glycol (molecular weight: 2,000, available from Wako Junyaku Co. Ltd.) to prepare a light-sensitive material (13).

EXAMPLE 12

The procedure for preparing the light-sensitive composition (PB-2) in Example 9 was repeated except for using the same amount of stearyl alcohol (available from Wako Junyaku Co. Ltd.) instead of using polyethylene glycol (molecular weight: 2,000, available from Wako Junyaku Co. Ltd.) to prepare a light-sensitive material (14).

EXAMPLE 13

The procedure for preparing the light-sensitive composition (PB-2) in Example 9 was repeated except for using the same amount of stearic amide (available from Wako Junyaku Co. Ltd.) instead of using polyethylene glycol (molecular weight: 2,000, available from Wako Junyaku Co. Ltd.) to prepare a light-sensitive material (15).

COMPARISON EXAMPLE 3

The procedure for preparing the light-sensitive composition (PB-1) in Example 8 was repeated except that polyethylene glycol (molecular weight: 2,000, available from Wako Junyaku Co. Ltd.) was not added, to prepare a light-sensitive material (16) for comparison.

EXAMPLE 14

The procedures in Examples 8, 9, 10, 11, 12 and 13 were repeated except for using the following pigment dispersion (GM-1) and the silver halide emulsion (EG-1) in stead of using (GY-1) and (EB-1), respectively, to prepare light-sensitive materials (17), (18), (19), (20), (21) and (22), respectively.

Preparation of Pigment Dispersion (GM-1)

To 270 g of the polymerizable compound (MN-1) was added 30 g of microlithred 3RA (tradename, available from Ciba-Geigy). The resulting mixture was pulverized for 1 hour at 5,000 r.p.m. using Eiger motor mill (produced by Eiger Engineering Co., Ltd.), to prepare a dispersion (GM-1).

COMPARISON EXAMPLE 4

The procedure in Comparison Example 3 was repeated except for using the above pigment dispersion (GM-1) and the silver halide emulsion (EG-1) instead of using (GY-1) and (EB-1), respectively, to prepare a light-sensitive material (23) for comparison.

EXAMPLE 15

The procedures in Examples 8, 9, 10, 11, 12 and 13 were repeated except for using the following pigment dispersion (GC-1) and the following silver halide emulsion (ER-1) instead of using (GY-1) and (EB-1), respectively, to prepare light-sensitive materials (24), (25), (26), (27), (28) and (29), respectively.

Preparation of Silver Halide Emulsion (ER-1)

In 1,600 ml of water were dissolved 20 g of gelatin and 0.5 g of sodium chloride, and the resulting gelatin solution was adjusted to pH 3.5 using 1N-sulfuric acid and was kept at 45° C. To the gelatin solution, 200 ml of an aqueous solution containing 71 g of potassium bromide and 200 ml of an aqueous solution containing 100 g of silver nitrate were added simultaneously at the same feed rate over 30 minutes. After 1 minute, to the resulting mixture was added the sensitizing dye (SR-1), and after 15 minutes, to the resulting mixture were further added 100 ml of an aqueous solution containing 3.65 g of potassium iodide and 100 ml of an aqueous solution containing 0.022 g of silver nitrate at the same feed rate over 5 minutes. To the resulting emulsion was then added 1.2 g of polyisobutylene/monosodium maleate copolymer. After the emulsion was washed with water for desalting, 3.5 g of gelatin was added to the emulsion. Then, to the emulsion was further added 0.45 mg of sodium thiosulfate to chemically sensitize the emulsion at 55° C. for 20 minutes. Thus, a silver halide emulsion (ER-1) (tetradecahedron silver iodobromide. monodispersed emulsion, yield: 460 g, fluctuation coefficient: 24%) having a mean grain size of the silver iodobromide of 0.13 μm was prepared.

Sensitizing dye (SR-1)

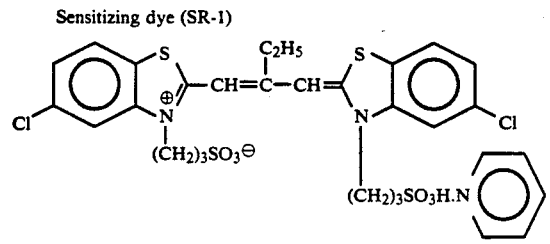

Preparation of Pigment Dispersion (GC-1)

To 270 g of the polymerizable compound (MN-1) was added 30 g of microlithblue 4GA (tradename, available from Ciba-Geigy). The resulting mixture was pulverized for 1 hour at 5,000 r.p.m. using Eiger motor mill (produced by Eiger Engineering Co., Ltd.), to prepare a dispersion (GC-1).

COMPARISON EXAMPLE 5

The procedure in Comparison Example 3 was repeated except for using the above pigment dispersion (GC-1) and the silver halide emulsion (ER-1) instead of using (GY-1) and (EB-1), respectively, and for changing the amount of (RD-2) to 6.2 g to prepare a light-sensitive material (30) for comparison.

EXAMPLE 16

The procedure in Example 14 was repeated except for using the dispersion (KB-2) of the following base precursor (45) instead of using (KB-1), to prepare light-sensitive materials (31), (32), (33), (34), (35) and (36).

Base precursor (45)

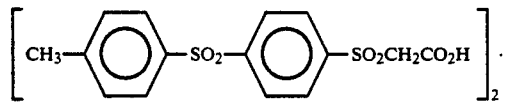

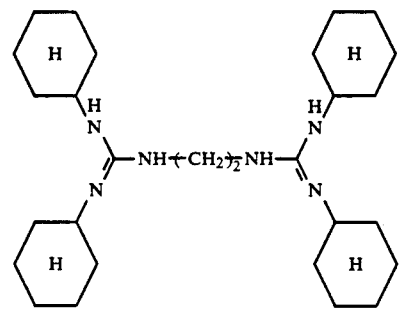

COMPARISON EXAMPLE 6

The procedure in Comparison Example 4 was repeated except for using (KB-2) instead of using (KB-1) to prepare a light-sensitive material (37) for comparison.

EXAMPLE 17

The procedure in Example 14 was repeated except for using the dispersion (KB-3) of the following base precursor (46) instead of using (KB-1), to prepare light-sensitive materials (38), (39), (40), (41), (42) and (43).

Base precursor (46)

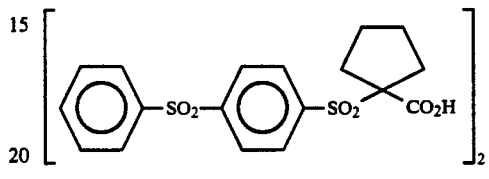

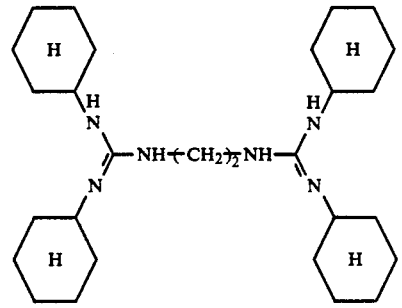

COMPARISON EXAMPLE 7

The procedure in Comparison Example 4 was repeated except for using (KB-3) instead of using (KB-1) to prepare a light-sensitive material (44) for comparison.

EXAMPLE 18

The procedure in Example 14 was repeated except for using the following pigment dispersion (GM-2) instead of using (GM-1), to prepare light-sensitive materials (45), (46), (47), (48), (49) and (50).

Preparation of Pigment Dispersion (GM-2)

To 270 g of the polymerizable compound (MN-2) was added 30 g of microlithred 3RA (tradename, available from Ciba-Geigy). The resulting mixture was pulverized for 1 hour at 5,000 r.p.m. using Eiger motor mill (produced by Eiger Engineering Co., Ltd.), to prepare a dispersion (GM-2).

Polymerizable Compound (MN-2)

(tradename: Kayarad R-684, available from Nippon Kayaku Co., Ltd.)

COMPARISON EXAMPLE 8

The procedure in Comparison Example 4 was repeated except for using the pigment dispersion (GM-2) instead of using (GM-1) to prepare a light-sensitive material (51) for comparison.

Each of the light-sensitive materials obtained in Examples 8–18 and Comparison Examples 3–8 was evaluated in the following manner, immediately after preparing and after having been left in an oven at 50° C. for 3 days. The light-sensitive material was imagewise exposed to light at 5,000 lux for 1 second using a tungsten lamp over a continuous filter having a transmission density of 0 4.0, and then heated on a hot plate at 135° C. or 150° C. for 15 seconds. Thereafter, the light-sensitive material was super posed on the image-receiving material (2) in such a manner that the light-sensitive layer faced the image-receiving layer, and they were passed through a pressure roller having a pressure of 500 kg/cm². Then the light-sensitive material was separated from the image-receiving material.

The above-mentioned CN value was calculated from the maximum density $D_{max}$ (corresponding to the unexposed portion) and the minimum density $D_{min}$ (corresponding to the posed portion) of the transferred positive image obtained on the image-receiving material.

The results are set forth in Table 2.

leuco dye in the condition of using the same base precursor. Further, the light sensitive material of the present invention is found to be considerably stabilized independently of variations with respect to a hue of pigment, a base precursor and a polymerizable compound.

With respect to any full color light-sensitive material prepared in the same manners of Examples 8–18 from a mixture with desirable ratio of light-sensitive microcapsule dispersions of three colors such as yellow, magenta and cyanide, the same effect of the invention as described above was obtained.

Further, analogous results are obtained in the case that a dye is used in place of the pigment.

EXAMPLE 16

It was confirmed in the following manner that the polar compound is attached to the base precursor.

In 9 g of the polymerizable compound (R604) was dispersed 1 g of the base precursor (43). In the dispersion was dissolved 0.2 g of polyethylene glycol (2,000),

TABLE 2

| Light-sensitive Material | Hue of Color Image | Additives | Base Precursor | Polymerizable Compound | Development Condition | CN Value immediately after prep. | CN Value after 3 days at 50° C. |
|---|---|---|---|---|---|---|---|
| (10) | Yellow | PEG 2,000 | (43) | R604 | 135° C./15 sec | 13.0 | 12.5 |
| (11) | Yellow | PEG 2,000 | (43) | R604 | 135° C./15 sec | 12.1 | 11.6 |
| (12) | Yellow | PEG 400 | (43) | R604 | 135° C./15 sec | 12.0 | 11.5 |
| (13) | Yellow | Octanediol | (43) | R604 | 135° C./15 sec | 12.0 | 11.4 |
| (14) | Yellow | Stearyl alcohol | (43) | R604 | 135° C./15 sec | 11.9 | 11.7 |
| (15) | Yellow | Stearic amide | (43) | R604 | 135° C./15 sec | 11.9 | 11.6 |
| (17) | Magenta | PEG 2,000 | (43) | R604 | 135° C./15 sec | 16.5 | 15.7 |
| (18) | Magenta | PEG 2,000 | (43) | R604 | 135° C./15 sec | 14.8 | 14.2 |
| (19) | Magenta | PEG 400 | (43) | R604 | 135° C./15 sec | 14.3 | 13.6 |
| (20) | Magenta | Octanediol | (43) | R604 | 135° C./15 sec | 14.3 | 13.9 |
| (21) | Magenta | Stearyl alcohol | (43) | R604 | 135° C./15 sec | 13.9 | 13.6 |
| (22) | Magenta | Stearic amide | (43) | R604 | 135° C./15 sec | 13.9 | 13.2 |
| (24) | Cyan | PEG 2,000 | (43) | R604 | 135° C./15 sec | 12.7 | 12.3 |
| (25) | Cyan | PEG 2,000 | (43) | R604 | 135° C./15 sec | 11.9 | 11.4 |
| (26) | Cyan | PEG 400 | (43) | R604 | 135° C./15 sec | 11.7 | 11.2 |
| (27) | Cyan | Octanediol | (43) | R604 | 135° C./15 sec | 11.7 | 11.3 |
| (28) | Cyan | Stearly alcohol | (43) | R604 | 135° C./15 sec | 11.3 | 11.1 |
| (29) | Cyan | Stearic amide | (43) | R604 | 135° C./15 sec | 11.3 | 10.9 |
| (31) | Magenta | PEG 2,000 | (45) | R604 | 135° C./15 sec | 16.0 | 13.5 |
| (32) | Magenta | PEG 2,000 | (45) | R604 | 135° C./15 sec | 14.1 | 12.1 |
| (33) | Magenta | PEG 400 | (45) | R604 | 135° C./15 sec | 13.5 | 11.2 |
| (34) | Magenta | Octanediol | (45) | R604 | 135° C./15 sec | 12.9 | 11.2 |
| (35) | Magenta | Stearly alcohol | (45) | R604 | 135° C./15 sec | 12.7 | 12.1 |
| (36) | Magenta | Stearic amide | (45) | R604 | 135° C./15 sec | 12.7 | 12.0 |
| (38) | Magenta | PEG 2,000 | (46) | R604 | 150° C./15 sec | 13.0 | 12.8 |
| (39) | Magenta | PEG 2,000 | (46) | R604 | 150° C./15 sec | 11.9 | 11.7 |
| (40) | Magenta | PEG 400 | (46) | R604 | 150° C./15 sec | 11.2 | 10.9 |
| (41) | Magenta | Octanediol | (46) | R604 | 150° C./15 sec | 10.5 | 10.2 |
| (42) | Magenta | Stearyl alcohol | (46) | R604 | 150° C./15 sec | 10.2 | 10.0 |
| (43) | Magenta | Stearic amide | (46) | R604 | 150° C./15 sec | 10.3 | 10.0 |
| (45) | Magenta | PEG 2,000 | (43) | R684 | 135° C./15 sec | 16.5 | 15.9 |
| (46) | Magenta | PEG 2,000 | (43) | R684 | 135° C./15 sec | 14.6 | 14.1 |
| (47) | Magenta | PEG 400 | (43) | R684 | 135° C./15 sec | 14.1 | 13.5 |
| (48) | Magenta | Octanediol | (43) | R684 | 135° C./15 sec | 14.1 | 13.6 |
| (49) | Magenta | Stearyl alcohol | (43) | R684 | 135° C./15 sec | 13.7 | 13.6 |
| (50) | Magenta | Stearic amide | (43) | R684 | 135° C./15 sec | 13.2 | 13.1 |
| (16) | Yellow | None | (43) | R604 | 135° C./15 sec | 12.9 | 1.07 |
| (23) | Magenta | None | (43) | R604 | 135° C./15 sec | 14.9 | 1.13 |
| (30) | Cyan | None | (43) | R604 | 135° C./15 sec | 11.5 | 1.05 |
| (37) | Magenta | None | (45) | R604 | 135° C./15 sec | 14.7 | 1.02 |
| (44) | Magenta | None | (46) | R604 | 150° C./15 sec | 11.6 | 6.5 |
| (51) | Magenta | None | (43) | R684 | 135° C./15 sec | 14.8 | 1.03 |

Remark: PEG 2,000 and 400 mean polyethylene glycols having average molecular weights of 2,000 and 400 respectively.

As is evident from the above results, the light-sensitive material of the invention employing a pigment as a color image forming substance has also considerably improved stability for storage, so it can present a high contrast image even after having been left at 50° C. for 3 days. Also, the light-sensitive material using a pigment is found to be more stabilized than a material using a and the mixture was stirred at 60° C. for 30 minutes The mixture was allowed to stand to precipitate the base precursor. The amount of polyethylene glycol (2,000) in the supernatant fraction was measured using GPC. The amount of polyethylene glycol was 0.04.

Further, the precipitated base precursor was collected and dissolved in methanol. The content of polyethylene glycol (2,000) in the methanol solution was measured. The amount of polyethylene glycol attached to the base precursor was 0.16.

The attachment of the polar compound to the base precursor was also observed in the case that octanediol, stearyl alcohol or stearic amide was used as the polar compound.

We claim:

1. A light-sensitive material comprising a support and a light-sensitive layer provided thereon which contains silver halide, a reducing agent, an ethylenically unsaturated polymerizable compound, a color image forming substance and a base precursor composed of a salt of an organic base with a carboxylic acid, wherein said silver halide, said reducing agent, said polymerizable compound, said color image forming substance and said base precursor are contained together in light-sensitive microcapsules which are dispersed in the light-sensitive layer, wherein the ethylenically unsaturated polymerizable compound is an acrylic ester or a methacrylic ester, the color image forming substance is a dye or a pigment, and the light-sensitive microcapsules further contain a polar compound represented by formula (I) or (II):

$(G)_n-Q-(L)_l-M-(G')_m$     (I)

wherein L is a divalent linking group; each of M and Q independently is an aliphatic hydrocarbon residue; each of G and G' independently is —OR$^1$, —SO$_2$NR$^1$R$^2$, —CONR$^1$R$^2$, —NR$^2$SO$_2$R$^1$, —NR$^2$COR$^1$, —N—CO—NR$^1$R$^2$ or —NH—COOR$^1$, wherein each of R$^1$ and R$^2$ independently is hydrogen or an alkyl group having 1-3 carbon atoms; l is 0 or 1; and each of m and n independently is 0 or an integer of 1-10, with the condition that m+n is 1-10;

$R^5-(CH_2CH_2O)_q-H$     (II)

wherein R$^5$ is a monovalent group selected from the group consisting of a hydroxy group, an alkoxy group, a polyalkoxy group consisting of alkoxy groups each of which has 3 or more carbon atoms, an aryloxy group, an amino group, an acylamino group and an acyloxy group, and q is an integer of not less than 2, and wherein the amount of silver salt contained in the light-sensitive layer is in the range of 1 mg/m$^2$ to 10 mg/m$^2$, the amount of the reducing agent is in the range of 0.1 to 1,500 mole % based on the amount of the silver salt, the amount of the dye or the pigment is 10 to 60 parts by weight based on 100 parts by weight of the polymerizable compound, the amount of the base precursor is not more than 50 weight % of the light-sensitive layer, the amount of the polar compound is in the range of 0.5 to 50 weight % based on the amount of the polymerizable compound, and the polar compound is attached to the surface of particles of the base precursor.

2. The light-sensitive material claimed in claim 1, wherein the polar compound has a molecular weight in the range of 100 to 400.

3. The light-sensitive material claimed in claim 1, wherein the polar compound is an alcohol having a molecular weight in the range of 100 to 400.

4. The light-sensitive material as claimed in claim 1, wherein the polar compound has a solubility in water of not more than 5 weight % at 25° C.

5. The light-sensitive material as claimed in claim 1, the polar compound is polyethylene glycol or its derivative having a molecular weight in the range of 200 to 20,000.

6. The light-sensitive material as claimed in claim 1, wherein the color image forming substance is a pigment.

7. The light-sensitive material as claimed in claim 1, wherein the color image forming substance comprises pigment particles surface treated to be lipophilic.

8. The light-sensitive material as claimed in claim 1, wherein the organic base of the base precursor is a diacidic, triacidic or tetraacidic base which is composed of two to four guanidine moieties and at least one residue of a hydrocarbon or a hetercyclic ring as a linking group of the guanidine moieties, said guanidine moiety corresponding to an atom group formed by removing one or two hydrogen atoms from the compound having the following formula (III):

wherein each of R$^6$, R$^7$, R$^8$, R$^9$ and R$^{10}$ independently is a monovalent group selected from the group consisting of hydrogen atom, an alkyl group, an alkenyl group, an alkynyl group, a cycloalkyl group, an aralkyl group, an aryl group and a heterocyclic group; and any two of R$^6$, R$^7$, R$^8$, R$^9$ and R$^{10}$ may be combined together to form a five-membered or six-membered nitrogen-containing heterocyclic ring.

* * * * *